US011309332B2

(12) United States Patent
Rajashekhar et al.

(10) Patent No.: US 11,309,332 B2
(45) Date of Patent: Apr. 19, 2022

(54) THREE-DIMENSIONAL MEMORY DEVICE CONTAINING FERROELECTRIC MEMORY ELEMENTS ENCAPSULATED BY TRANSITION METAL-CONTAINING CONDUCTIVE ELEMENTS AND METHOD OF MAKING THEREOF

(71) Applicant: SANDISK TECHNOLOGIES LLC, Addison, TX (US)

(72) Inventors: Adarsh Rajashekhar, Santa Clara, CA (US); Raghuveer S. Makala, Campbell, CA (US); Rahul Sharangpani, Fremont, CA (US); Seung-Yeul Yang, Pleasanton, CA (US); Fei Zhou, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 167 days.

(21) Appl. No.: 16/568,668

(22) Filed: Sep. 12, 2019

(65) Prior Publication Data

US 2021/0082955 A1 Mar. 18, 2021

(51) Int. Cl.
*H01L 27/11582* (2017.01)
*H01L 27/1157* (2017.01)
(Continued)

(52) U.S. Cl.
CPC .... *H01L 27/11597* (2013.01); *H01L 27/1159* (2013.01); *H01L 27/11587* (2013.01)

(58) Field of Classification Search
CPC ... H01L 27/2481–249; H01L 27/11514; H01L 27/11597; H01L 27/11524;
(Continued)

(56) References Cited

U.S. PATENT DOCUMENTS 5,915,167 A 6/1999 Leedy
9,136,275 B2 * 9/2015 Yoo ................... H01L 27/11556
(Continued)

FOREIGN PATENT DOCUMENTS

EP 3499580 A1 6/2019
KR 10-2018-0059271 A 6/2018

OTHER PUBLICATIONS

Al-Shareef, H.N. et al., "Contribution of Electrodes and Microstructures to the Electrical Properties of Pb(Zr0.53Ti0.47)O3 Thin Film Capacitors," J. Mater. Res., vol. 9, No. 11, pp. 2968-2975, (1994).
(Continued)

*Primary Examiner* — Mary A Wilczewski
*Assistant Examiner* — Tsz K Chiu
(74) *Attorney, Agent, or Firm* — The Marbury Law Group PLLC

(57) ABSTRACT

A three-dimensional ferroelectric memory device includes an alternating stack of insulating layers and electrically conductive layers located over a substrate, where each of the electrically conductive layers contains a transition metal element-containing conductive liner and a conductive fill material portion, a vertical semiconductor channel extending vertically through the alternating stack, a vertical stack of tubular transition metal element-containing conductive spacers laterally surrounding the vertical semiconductor channel and located at levels of the electrically conductive layers, and a ferroelectric material layer located between the vertical stack of tubular transition metal element-containing conductive spacers and the transition metal element-containing conductive liner.

11 Claims, 31 Drawing Sheets

(51) Int. Cl.
   *H01L 27/11597* (2017.01)
   *H01L 27/1159* (2017.01)
   *H01L 27/11587* (2017.01)

(58) Field of Classification Search
   CPC .......... H01L 27/11556; H01L 27/1157; H01L 27/11582; H01L 27/11585; H01L 29/516; H01L 29/40111; H01L 29/78391
   See application file for complete search history.

(56) References Cited

U.S. PATENT DOCUMENTS

| | | | |
|---|---|---|---|
| 9,230,983 | B1 | 1/2016 | Sharangpani et al. |
| 9,379,124 | B2 | 6/2016 | Sharangpani et al. |
| 9,496,419 | B2 | 11/2016 | Sharangpani et al. |
| 9,570,455 | B2 | 2/2017 | Sharangpani et al. |
| 9,589,839 | B1* | 3/2017 | Ikawa .............. H01L 27/11582 |
| 9,698,223 | B2 | 7/2017 | Sharangpani et al. |
| 9,748,174 | B1* | 8/2017 | Amano ............ H01L 29/40117 |
| 9,768,270 | B2 | 9/2017 | Gunji-Yoneoka et al. |
| 9,941,299 | B1* | 4/2018 | Chen ................ H01L 27/11595 |
| 10,283,513 | B1 | 5/2019 | Zhou et al. |
| 10,833,101 | B2* | 11/2020 | Shimomura .......... H01L 29/516 |
| 10,916,287 | B2* | 2/2021 | Zhang ............... H01L 29/78391 |
| 10,916,654 | B2* | 2/2021 | Fujii .................... G11C 16/08 |
| 10,923,502 | B2* | 2/2021 | Sato ................. H01L 27/11587 |
| 10,937,801 | B2* | 3/2021 | Otsu ................. H01L 27/11573 |
| 10,937,809 | B1* | 3/2021 | Sharangpani ..... H01L 27/11597 |
| 10,950,626 | B2* | 3/2021 | Kai ................... H01L 27/11565 |
| 2011/0115049 | A1 | 5/2011 | Kim ...................... H01L 27/249 257/530 |
| 2012/0119287 | A1* | 5/2012 | Park .................. H01L 27/11519 257/329 |
| 2013/0095646 | A1* | 4/2013 | Alsmeier ............ H01L 29/4916 438/594 |
| 2014/0048868 | A1* | 2/2014 | Kim .................. H01L 27/11582 257/324 |
| 2014/0061776 | A1* | 3/2014 | Kwon ............... H01L 27/11575 257/329 |
| 2014/0063890 | A1* | 3/2014 | Lee ................... H01L 27/11524 365/63 |
| 2015/0041873 | A1* | 2/2015 | Karda ..................... H01L 29/24 257/295 |
| 2015/0060992 | A1* | 3/2015 | Taekyung ......... H01L 27/11582 257/324 |
| 2015/0380419 | A1 | 12/2015 | Gunji-Yoneoka et al. |
| 2015/0380422 | A1 | 12/2015 | Sharangpani et al. |
| 2016/0141294 | A1* | 5/2016 | Peri .................. H01L 21/28568 257/324 |
| 2016/0149002 | A1 | 5/2016 | Sharangpani et al. |
| 2016/0181271 | A1* | 6/2016 | Yada ................... H01L 27/1157 438/264 |
| 2016/0225860 | A1* | 8/2016 | Karda ................... H01L 29/516 |
| 2016/0343726 | A1* | 11/2016 | Yune ..................... G06F 3/0656 |
| 2016/0351497 | A1* | 12/2016 | Peri .................. H01L 23/53266 |
| 2017/0117295 | A1* | 4/2017 | Karda ................ H01L 27/1159 |
| 2017/0125436 | A1* | 5/2017 | Sharangpani ..... H01L 27/11582 |
| 2017/0194337 | A1* | 7/2017 | Lee ..................... H01L 29/7926 |
| 2017/0352669 | A1 | 12/2017 | Sharangpani et al. |
| 2018/0130823 | A1 | 5/2018 | Kim |
| 2018/0323214 | A1* | 11/2018 | Karda ............... H01L 29/78642 |
| 2019/0139973 | A1 | 5/2019 | Zhou et al. |
| 2020/0203381 | A1* | 6/2020 | Rabkin ............. H01L 21/02172 |
| 2020/0303418 | A1* | 9/2020 | Sakuma ................. G11C 16/10 |
| 2020/0303558 | A1* | 9/2020 | Fujii ................. H01L 27/11524 |
| 2021/0050371 | A1* | 2/2021 | Sharangpani ..... H01L 29/40111 |
| 2021/0050372 | A1* | 2/2021 | Sharangpani ..... H01L 29/78391 |
| 2021/0066348 | A1* | 3/2021 | Prasad .............. H01L 21/02189 |
| 2021/0074727 | A1* | 3/2021 | Prasad .............. H01L 27/11587 |
| 2021/0135010 | A1* | 5/2021 | Yamazaki ........... H01L 29/7869 |

OTHER PUBLICATIONS

Ooba, K. et al., "Self-Limiting Atomic-Layer Selective Deposition of Silicon Nitride by Temperature-Controlled Method," Extended Abstracts of the 1998 International Conference on Solid State Devices and Materials, Hiroshima, pp. 22-23, (1998).

Ramesh, R. et al., "Fatigue and Retention in Ferroelectric Y—Ba—Cu—O/Pb—Zr—Ti—O/Y—Ba—Cu—O Heterostructures," Appl. Phys. Lett. vol. 61, No. 13, pp. 1537-1539, (1992); https://doi.org/10.1063/1.107488.

Ramesh, R. et al., "Ferroelectric La—Sr—Co—O/Pb—Zr—Ti—O/La—Sr—Co—O Heterostructures on Silicon via Template Growth," Appl. Phys. Lett. vol. 63, No. 26, pp. 3592-3594, (1993); https://doi.org/10.1063/1.110106.

Eom, C. B. et al., "Single-Crystal Epitaxial Thin Films of the Isotropic Metallic Oxides Oxides Sr1—xCaxRuO3(0≤x≤1)," Science, vol. 258, pp. 1766-1769, (1992).

Ramesh, R. et al., "Epitaxial Cuprate Superconductor/Ferroelectric Heterostructures," Science, vol. 252, pp. 944-946, (1991).

U.S. Appl. No. 16/227,889, filed Dec. 20, 2018, SanDisk Technologies LLC.

U.S. Appl. No. 16/249,300, filed Jan. 16, 2019, SanDisk Technologies LLC.

U.S. Appl. No. 16/291,673, filed Mar. 4, 2019, SanDisk Technologies LLC.

U.S. Appl. No. 16/362,857, filed Mar. 25, 2019, SanDisk Technologies LLC.

U.S. Appl. No. 16/362,895, filed Mar. 25, 2019, SanDisk Technologies LLC.

U.S. Appl. No. 16/412,764, filed May 15, 2019, SanDisk Technologies LLC.

U.S. Appl. No. 16/454,458, filed Jun. 27, 2019, SanDisk Technologies LLC.

U.S. Appl. No. 16/454,475, filed Jun. 27, 2019, SanDisk Technologies LLC.

U.S. Appl. No. 16/456,736, filed Jun. 28, 2019, SanDisk Technologies LLC.

U.S. Appl. No. 16/457,687, filed Jun. 28, 2019, SanDisk Technologies LLC.

U.S. Appl. No. 16/457,721, filed Jun. 28, 2019, SanDisk Technologies LLC.

U.S. Appl. No. 16/530,256, filed Aug. 2, 2019, SanDisk Technologies LLC.

Notification of Transmittal of the International Search Report and Written Opinion of the International Search Authority for International Patent Application No. PCT/US2020/025891, dated Jul. 29, 2020, 10 pages.

* cited by examiner

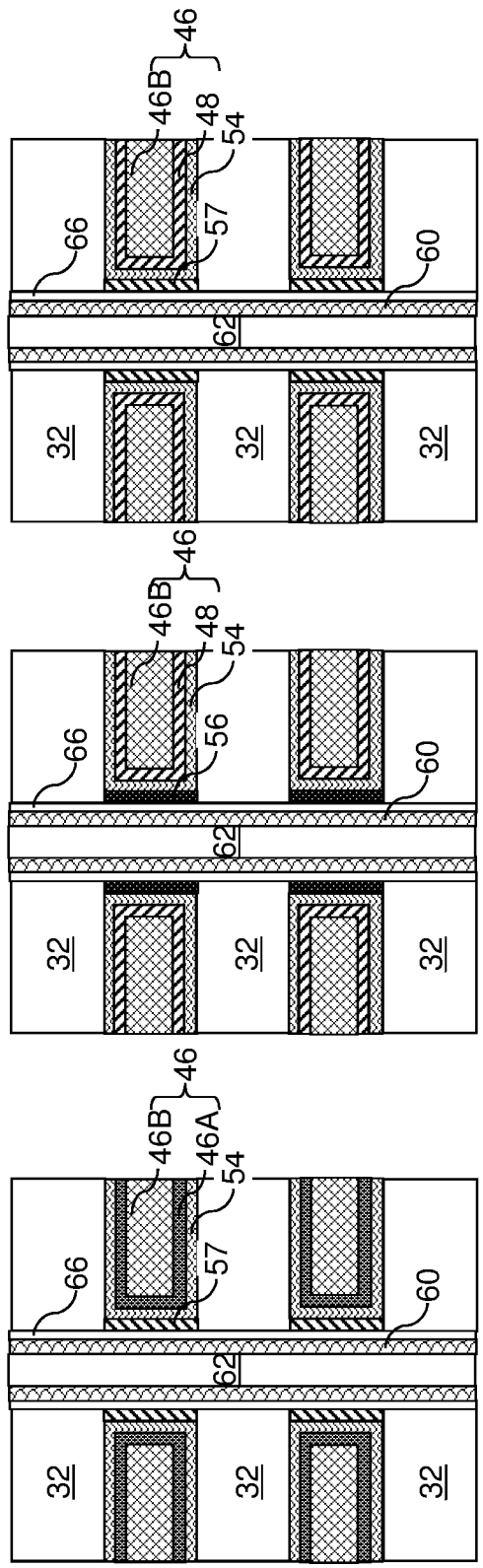

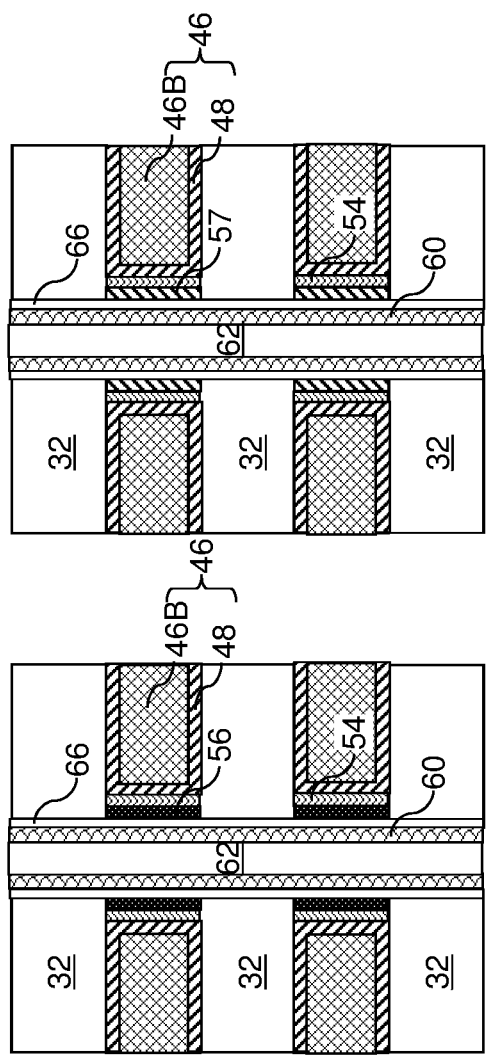

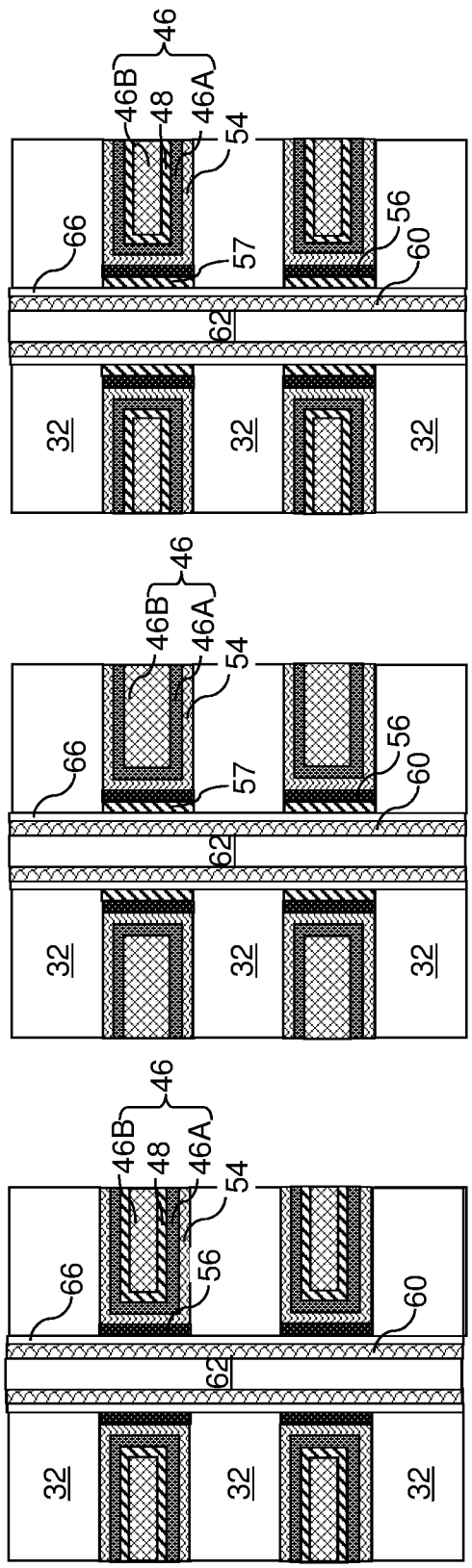

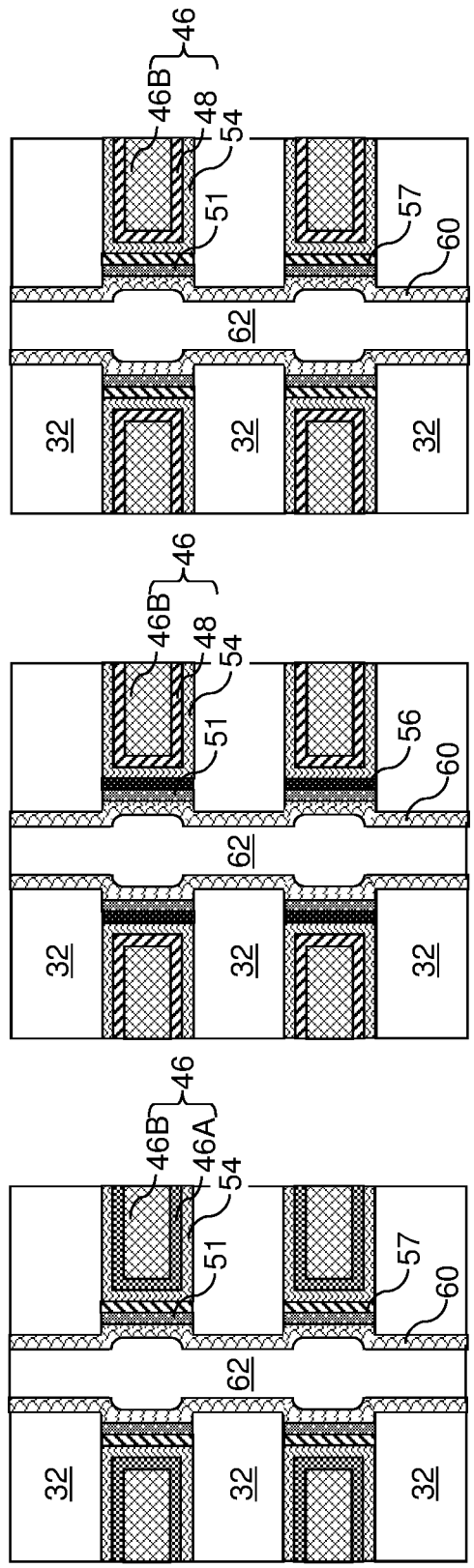

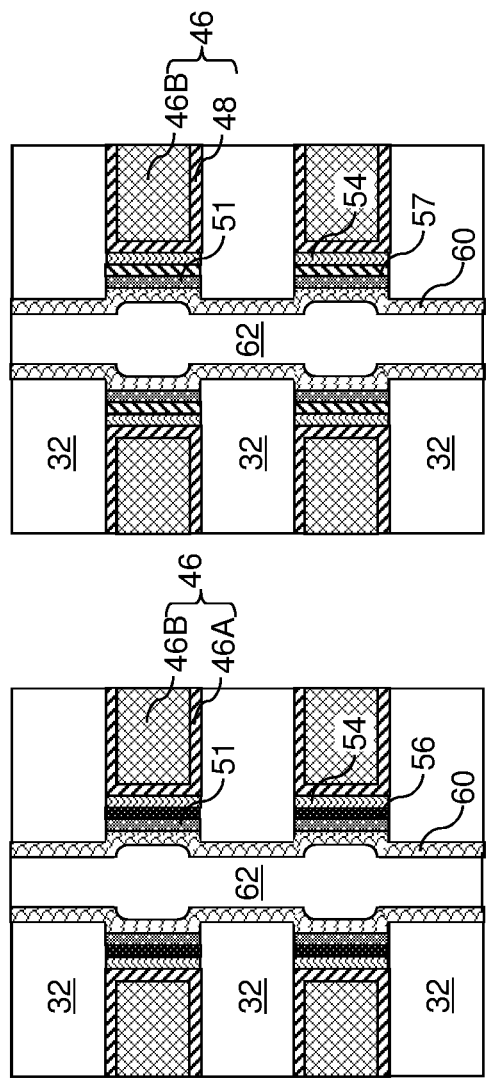

US 11,309,332 B2

THREE-DIMENSIONAL MEMORY DEVICE CONTAINING FERROELECTRIC MEMORY ELEMENTS ENCAPSULATED BY TRANSITION METAL-CONTAINING CONDUCTIVE ELEMENTS AND METHOD OF MAKING THEREOF

FIELD

The present disclosure relates generally to the field of semiconductor devices, and particular to a three-dimensional memory device containing ferroelectric memory elements encapsulated by transition metal-containing conductive elements and methods of manufacturing the same.

BACKGROUND

A ferroelectric material refers to a material that displays spontaneous polarization of electrical charges in the absence of an applied electric field. The net polarization P of electrical charges within the ferroelectric material is non-zero in the minimum energy state. Thus, spontaneous ferroelectric polarization of the material occurs, and the ferroelectric material accumulates surfaces charges of opposite polarity types on two opposing surfaces. Polarization P of a ferroelectric material as a function of an applied voltage V thereacross displays hysteresis. The product of the remanent polarization and the coercive field of a ferroelectric material is a metric for characterizing effectiveness of the ferroelectric material.

A ferroelectric memory device is a memory device containing the ferroelectric material which is used to store information. The ferroelectric material acts as the memory material of the memory device. The dipole moment of the ferroelectric material is programmed in two different orientations (e.g., "up" or "down" polarization positions based on atom positions, such as oxygen and/or metal atom positions, in the crystal lattice) depending on the polarity of the applied electric field to the ferroelectric material to store information in the ferroelectric material. The different orientations of the dipole moment of the ferroelectric material may be detected by the electric field generated by the dipole moment of the ferroelectric material. For example, the orientation of the dipole moment may be detected by measuring electrical current passing through a semiconductor channel provided adjacent to the ferroelectric material in a field effect transistor ferroelectric memory device.

SUMMARY

According to an aspect of the present disclosure, a three-dimensional ferroelectric memory device includes an alternating stack of insulating layers and electrically conductive layers located over a substrate, where each of the electrically conductive layers contains a transition metal element-containing conductive liner and a conductive fill material portion, a vertical semiconductor channel extending vertically through the alternating stack, a vertical stack of tubular transition metal element-containing conductive spacers laterally surrounding the vertical semiconductor channel and located at levels of the electrically conductive layers, and a ferroelectric material layer located between the vertical stack of tubular transition metal element-containing conductive spacers and the transition metal element-containing conductive liner.

According to another aspect of the present disclosure, a method of forming a three-dimensional ferroelectric memory device comprises forming an alternating stack of insulating layers and sacrificial material layers over a substrate, forming memory openings vertically extending through the alternating stack, forming a vertical semiconductor channel in each of the memory openings, forming backside recesses by removing the sacrificial material layers selective to the insulating layers, forming a vertical stack of tubular transition metal element-containing conductive spacers around each of the memory openings prior to or after formation of the vertical semiconductor channels, wherein each of the tubular transition metal element-containing conductive spacers laterally surrounds a respective one of the vertical semiconductor channels, forming a ferroelectric material layer in the backside recesses on the tubular transition metal element-containing conductive spacers, and forming electrically conductive layers in the backside recesses by forming a transition metal element-containing conductive liner on the ferroelectric material layer, and forming a conductive fill material portion over the transition metal element-containing conductive liner.

BRIEF DESCRIPTION OF THE DRAWINGS

FIGS. 9F-9O are alternative embodiments of a region of the first exemplary structure at a processing step corresponding to a processing step of FIG. 9E.

FIGS. 15I-15O are alternative embodiments of a region of the second exemplary structure at a processing step corresponding to a processing step of FIG. 15H.

DETAILED DESCRIPTION

Figure 1:
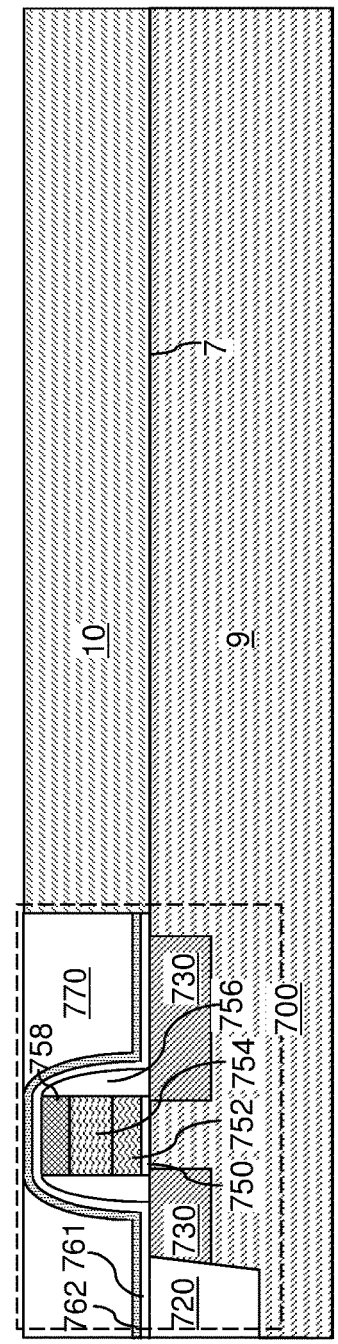
FIG. 1 is a schematic vertical cross-sectional view of a first exemplary structure after formation of at least one peripheral device and a semiconductor material layer according to a first embodiment of the present disclosure.

As discussed above, the present disclosure is directed to three-dimensional memory devices including a vertical stack of multilevel memory arrays and methods of making thereof, the various aspects of which are described below. The embodiments of the disclosure may be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and may be fabricated employing the various embodiments described herein.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many number of external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, a first exemplary structure according to the first embodiment of the present disclosure is illustrated, which may be employed, for example, to fabricate a device structure containing vertical NAND memory devices. The first exemplary structure includes a substrate (9, 10), which may be a semiconductor substrate. The substrate can include a substrate semiconductor layer 9 and an optional semiconductor material layer 10. The substrate semiconductor layer 9 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which may be, for example, a topmost surface of the substrate semiconductor layer 9. The major surface 7 may be a semiconductor surface. In one embodiment, the major surface 7 may be a single crystalline semiconductor surface, such as a single crystalline semiconductor surface.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to $1.0$ S/m in the absence of electrical dopants therein, and is capable of producing a doped material having electrical conductivity in a range from $1.0$ S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

In one embodiment, at least one semiconductor device 700 for a peripheral circuitry may be formed on a portion of the substrate semiconductor layer 9. The at least one semiconductor device can include, for example, field effect transistors. For example, at least one shallow trench isolation structure 720 may be formed by etching portions of the substrate semiconductor layer 9 and depositing a dielectric material therein. A gate dielectric layer, at least one gate conductor layer, and a gate cap dielectric layer may be formed over the substrate semiconductor layer 9, and may be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 may be formed around the at least one gate structure (750, 752, 754, 758) by depositing and anisotropically etching a dielectric liner. Active regions 730 may be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 may be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 may be a silicon oxide layer, and the second dielectric liner 762 may be a silicon nitride layer. The least one semiconductor device for the peripheral circuitry can contain a driver circuit for memory devices to be subsequently formed, which can include at least one NAND device.

A dielectric material such as silicon oxide may be deposited over the at least one semiconductor device, and may be subsequently planarized to form a planarization dielectric layer 770. In one embodiment the planarized top surface of the planarization dielectric layer 770 may be coplanar with a top surface of the dielectric liners (761, 762). Subsequently, the planarization dielectric layer 770 and the dielectric liners (761, 762) may be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, may be formed on the top surface of the substrate semiconductor layer 9 prior to, or after, formation of the at least one semiconductor device 700 by deposition of a single crystalline semiconductor material, for example, by selective epitaxy. The deposited semiconductor material may be the same as, or may be different from, the semiconductor material of the substrate semiconductor layer 9. The deposited semiconductor material may be any material that may be employed for the substrate semiconductor layer 9 as described above. The single crystalline semiconductor material of the semiconductor material layer 10 may be in epitaxial alignment with the single crystalline structure of the substrate semiconductor layer 9. Portions of the deposited semiconductor material located above the top surface of the planarization dielectric layer 770 may be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers may be provided between the memory array region 100 and the peripheral device region 200. In an alternative embodiment, the at least one semiconductor device 700 is formed under the memory array region 100 in a CMOS under array ("CUA") configuration. In this case, the peripheral device region 200 may be omitted or used in combination with the CUA configuration. In another alternative embodiment, the at least one semiconductor device 700 may be formed on a separate substrate and then bonded to substrate (9, 10) containing the memory array region 100.

Figure 2:
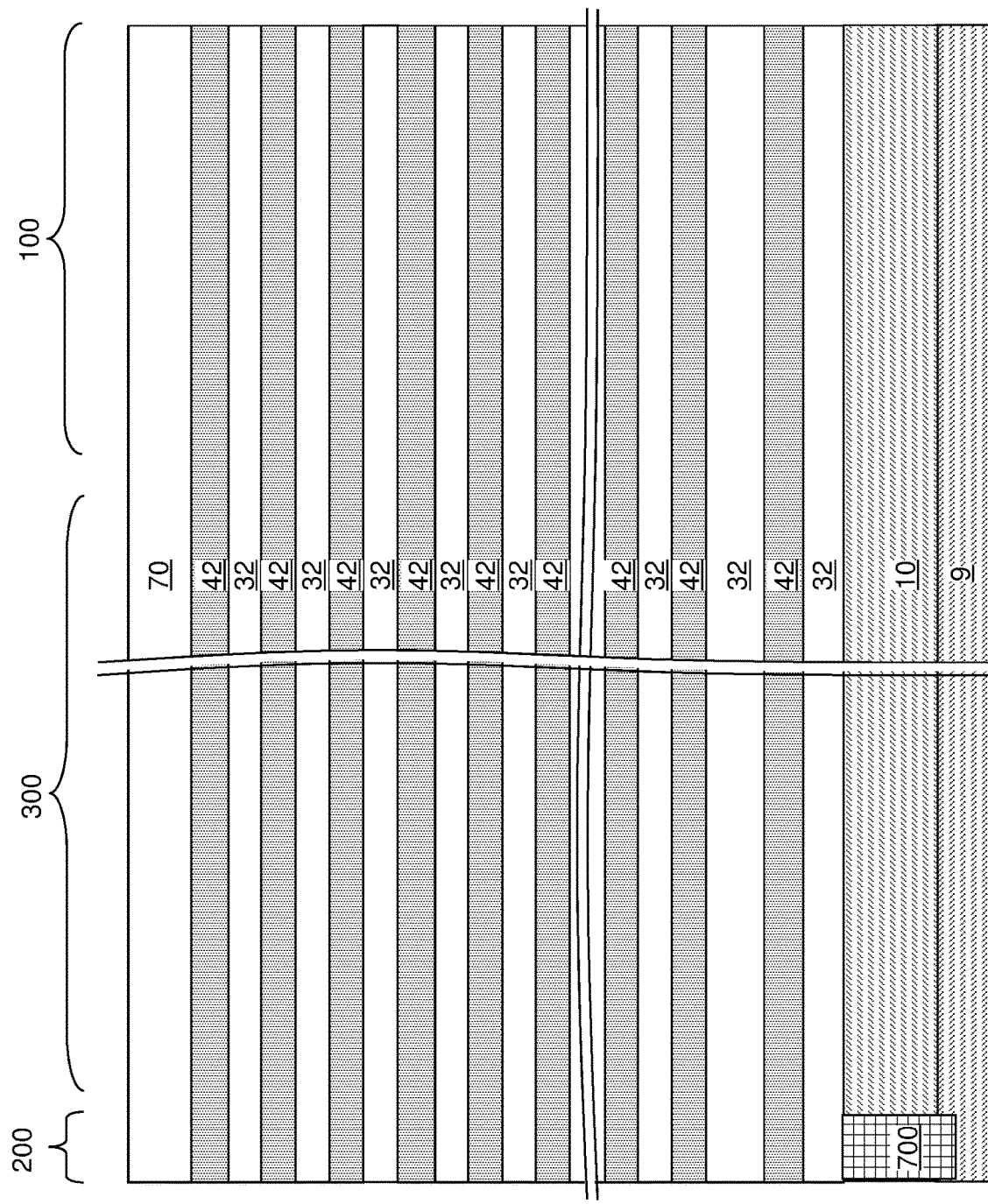
FIG. 2 is a schematic vertical cross-sectional view of the first exemplary structure after formation of an alternating stack of insulating layers and sacrificial material layers according to the first embodiment of the present disclosure.

Referring to FIG. 2, a stack of an alternating plurality of first material layers (which may be insulating layers 32) and second material layers (which may be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer may be an insulating layer 32, and each second material layer may be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 may be at least one insulating material. As such, each insulating layer 32 may be an insulating material layer. Insulating materials that may be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 may be silicon oxide.

The second material of the sacrificial material layers 42 is a sacrificial material that may be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 may be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 may be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 may be deposited, for example, by chemical vapor deposition (CVD). For example, if silicon oxide is employed for the insulating layers 32, tetraethyl orthosilicate (TEOS) may be employed as the precursor material for the CVD process. The second material of the sacrificial material layers 42 may be formed, for example, CVD or atomic layer deposition (ALD).

The sacrificial material layers 42 may be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 may be in a range from 20 nm to 50 nm, although lesser and greater thicknesses may be employed for each insulating layer 32 and for each sacrificial material layer 42. The number of repetitions of the pairs of an insulating layer 32 and a sacrificial material layer (e.g., a control gate electrode or a sacrificial material layer) 42 may be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers may be omitted.

Optionally, an insulating cap layer 70 may be formed over the alternating stack (32, 42). The insulating cap layer 70 includes a dielectric material that is different from the material of the sacrificial material layers 42. In one embodiment, the insulating cap layer 70 can include a dielectric material that may be employed for the insulating layers 32 as described above. The insulating cap layer 70 can have a greater thickness than each of the insulating layers 32. The insulating cap layer 70 may be deposited, for example, by chemical vapor deposition. In one embodiment, the insulating cap layer 70 may be a silicon oxide layer.

Figure 3:
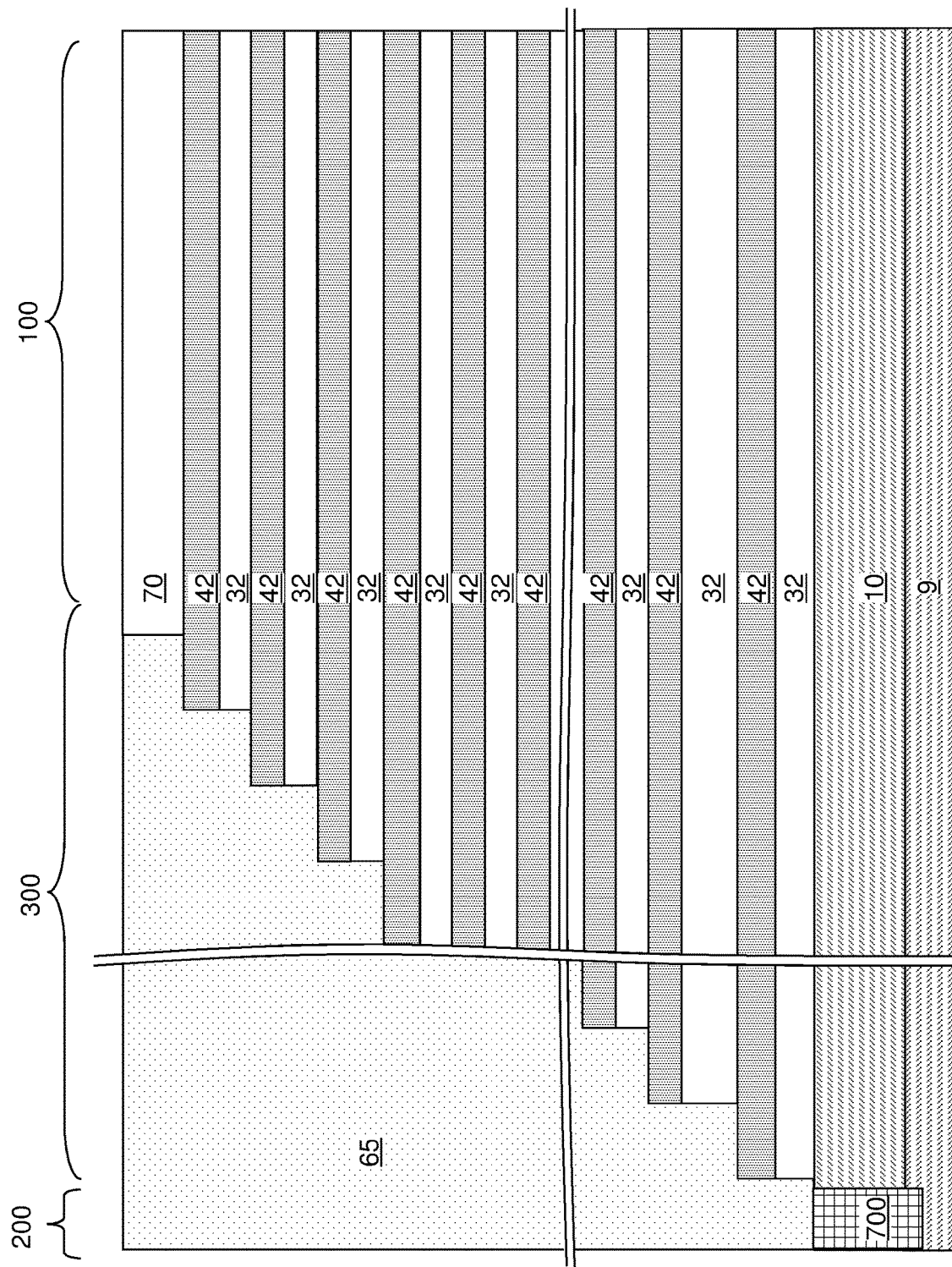
FIG. 3 is a schematic vertical cross-sectional view of the first exemplary structure after formation of stepped terraces and a retro-stepped dielectric material portion according to the first embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity may be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases may be formed along a first horizontal direction hd1 such that each vertical step has the height of a plurality of pairs of an insulating layer 32 and a sacrificial material layer 42, and the number of columns may be at least the number of the plurality of pairs. Each column of staircase may be vertically offset from each other such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) may be formed in the stepped cavity by deposition of a dielectric material therein. For example, a dielectric material such as silicon oxide may be deposited in the stepped cavity. Excess portions of the deposited dielectric material may be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 may be formed through the insulating cap layer 70 and a subset of the sacrificial material layers 42 located at drain select levels. The drain select level isolation structures 72 may be formed, for example, by forming drain select level isolation trenches and filling the drain select level isolation trenches with a dielectric material such as silicon oxide. Excess portions of the dielectric material may be removed from above the top surface of the insulating cap layer 70.

Figure 4A:
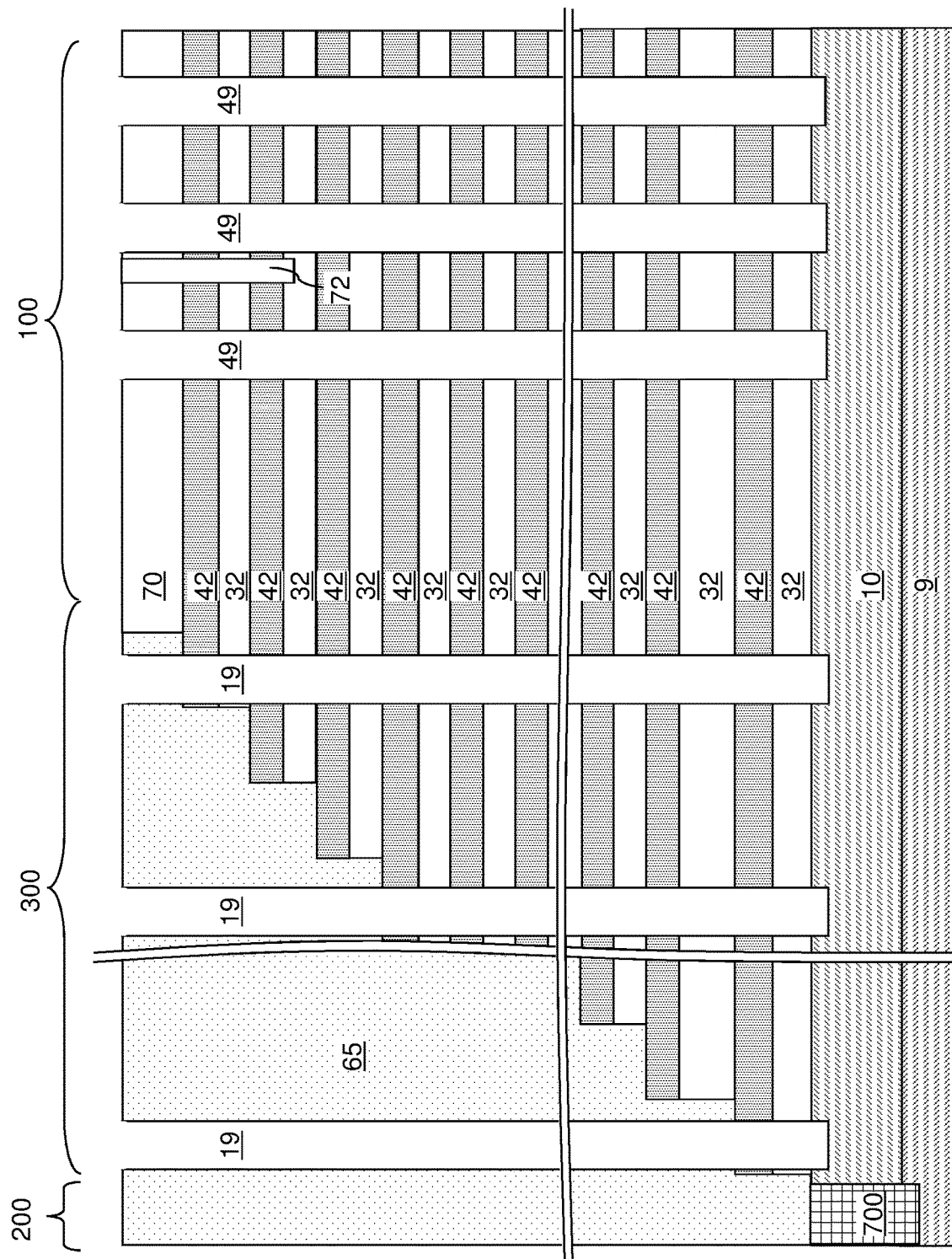
FIG. 4A is a schematic vertical cross-sectional view of the first exemplary structure after formation of memory openings and support openings according to the first embodiment of the present disclosure.
Figure 4B:
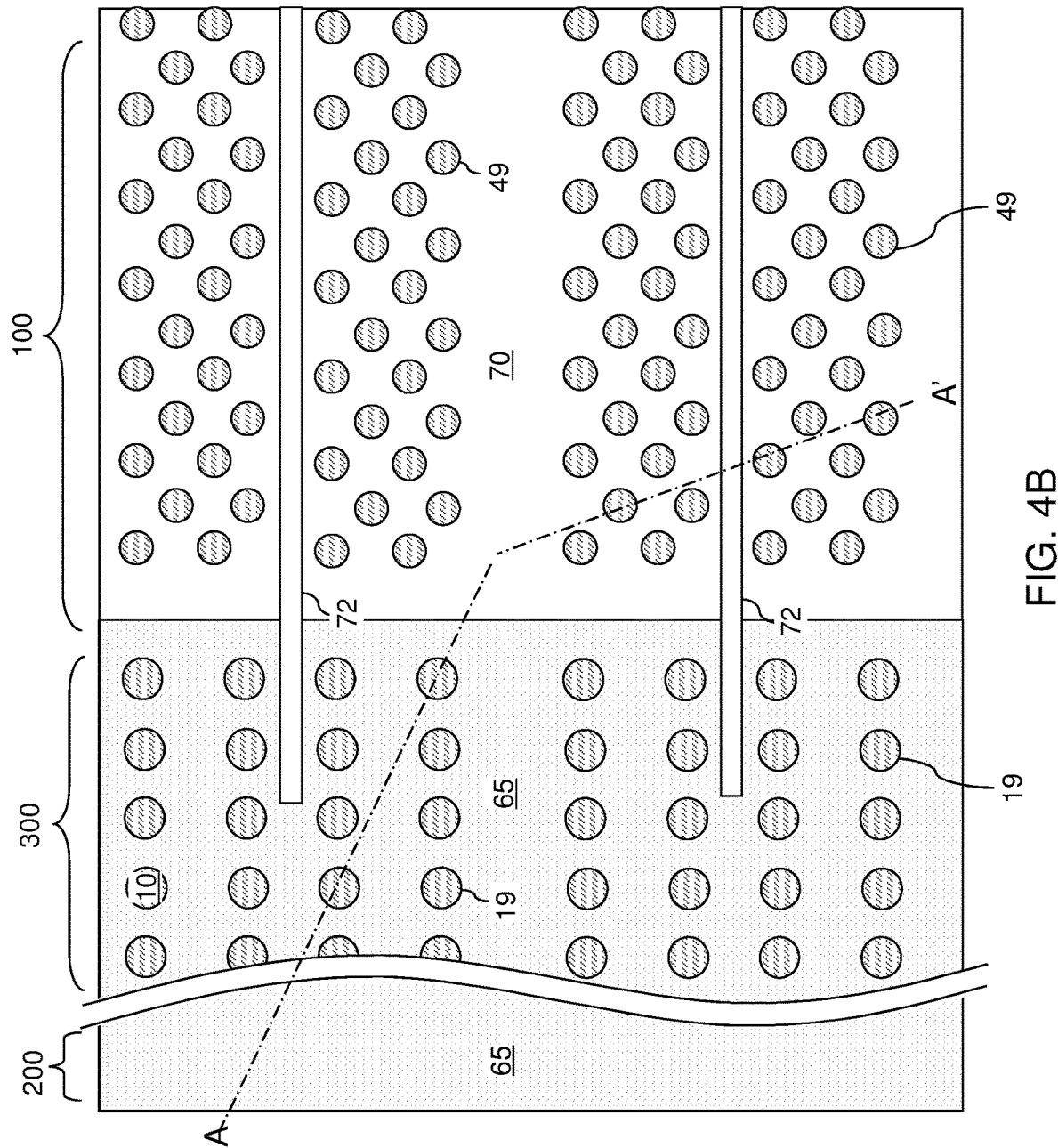
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer may be formed over the insulating cap layer 70 and the retro-stepped dielectric material portion 65, and may be lithographically patterned to form openings therein. The openings include a first set of openings formed over the memory array region 100 and a second set of openings formed over the staircase region 300. The pattern in the lithographic material stack may be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch may be, for example, a series of reactive ion etches. The sidewalls of the memory openings 49 and the support openings 19 may be substantially vertical, or may be tapered. The patterned lithographic material stack may be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth may be, for example, in a range from 1 nm to 50 nm, although lesser and greater recess depths can also be employed. The overetch is optional, and may be omitted. If the overetch is not performed, the bottom surfaces of the memory openings 49 and the support openings 19 may be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 may be formed in the memory array region 100.

A two-dimensional array of support openings 19 may be formed in the staircase region 300. The substrate semiconductor layer 9 and the semiconductor material layer 10 collectively constitutes a substrate (9, 10), which may be a semiconductor substrate. Alternatively, the semiconductor material layer 10 may be omitted, and the memory openings 49 and the support openings 19 may be extend to a top surface of the substrate semiconductor layer 9.

FIGS. 5A-5H illustrate structural changes in a memory opening 49, which is one of the memory openings 49 in the first exemplary structure of FIGS. 4A and 4B. The same structural change occurs simultaneously in each of the other memory openings 49 and in each of the support openings 19.

Figure 5C:
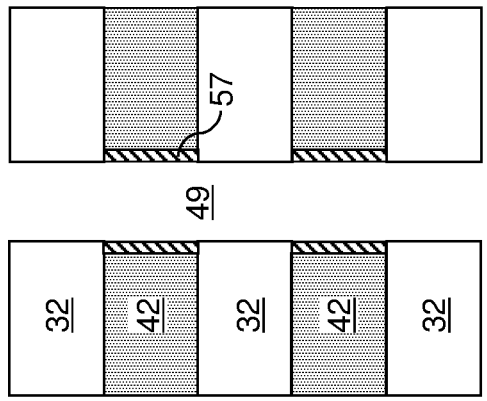
FIGS. 5A-5G are sequential schematic vertical cross-sectional views of a memory opening within the first exemplary structure during formation of a memory opening fill structure therein according to a first embodiment of the present disclosure.
Figure 5B:
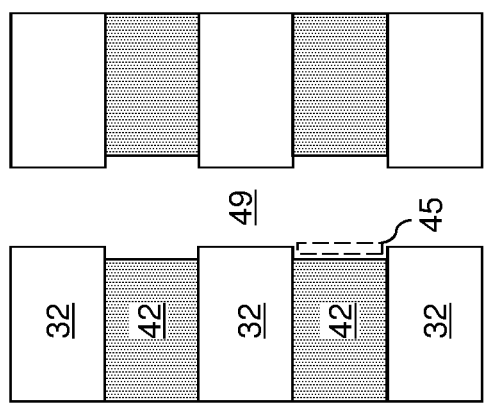
Figure 5A:
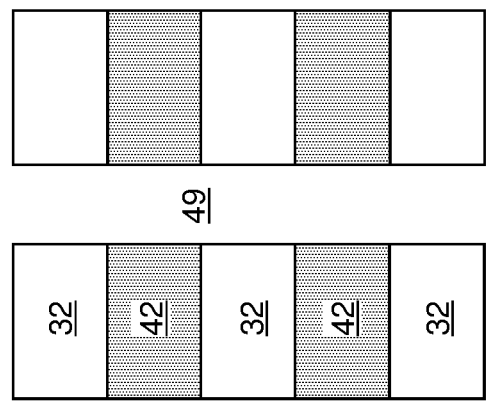

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 may be in a range from 0 nm to 30 nm, although greater recess depths can also be employed. Optionally, the sacrificial material layers 42 may be laterally recessed partially to form lateral recesses (not shown), for example, by an isotropic etch.

Referring to FIG. 5B, an isotropic etch process may be performed to etch proximal portions of the sacrificial material layers 42 selective to the insulating layers 32. For example, if the sacrificial material layers 42 include silicon nitride and if the insulating layers 32 include silicon oxide, a timed phosphoric acid wet etch process may be used to laterally recess sidewalls of the sacrificial material layers 42 relative to sidewalls of the insulating layers 32. Annular recesses 45 may be formed by laterally recessing the sidewalls of the sacrificial material layers 42 selective to the insulating layers 32 around each memory opening 49. As used herein, removal of a first material is "selective to" a second material if the etch rate for the first material is at least three times the etch rate for the second material. Lateral etch distance of the isotropic etch process may be in a range from 3 nm to 15 nm, although lesser and greater lateral etch distances can also be employed. The lateral etch distance is the distance between a vertical plane including a recessed sidewall of a sacrificial material layer 42 and a vertical plane including a sidewall of an insulating layer 32 around each memory opening 49.

Referring to FIG. 5C, in one alternative embodiment, a vertical stack of tubular transition metal element spacers 57 may be selectively deposited in the annular recesses 45. The transition metal element spacers 57 may consist essentially of at least one transition metal element that is capable of forming an electrically conductive metal oxide. As used herein, a conductive metal oxide refers to a metal oxide that is conductive, i.e., having electrical conductivity greater than $1.0 \times 10^5$ S/m. For example, $RuO_2$ has electrical conductivity of about $2.7 \times 10^6$ m/s at room temperature. In one embodiment, the transition metal element spacers 57 can consist essentially of at least one transition metal element (such as a single transition metal element) that is selected from iridium, ruthenium, palladium, osmium, rhenium, molybdenum or cobalt. For example, the spacers 57 may comprise ruthenium spacers which are selectively deposited by metal organic atomic layer deposition (MOALD) on surfaces of silicon nitride sacrificial material layers 42 exposed in annular recesses 45 without being deposited on surfaces of the insulating layers 32 exposed in the memory opening 49.

In an alternative embodiment, a transition metal element layer may be conformally deposited in the annular recesses 45 and on physically exposed sidewalls of the insulating layers 32 around each of the memory openings 49. In one embodiment, the transition metal element layer can consist essentially of a single transition metal element that is capable of forming the electrically conductive metal oxide. In one embodiment, the transition metal element layer can consist essentially of at least one transition metal element (such as a single transition metal element) that is selected from iridium, ruthenium, palladium, osmium, rhenium, molybdenum or cobalt. The thickness of the transition metal element layer may be the same as, or greater than, the horizontal width of the annular recesses 45. Then, portions of the transition metal element layer located outside the annular recesses 45 are removed by anisotropically etching the transition metal element layer. The vertical stack of tubular transition metal element spacers 57 is then formed within the annular recesses 45 around each memory opening 49.

Figure 5E:
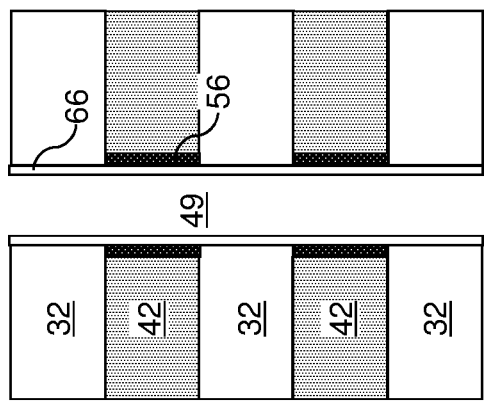
Figure 5D:
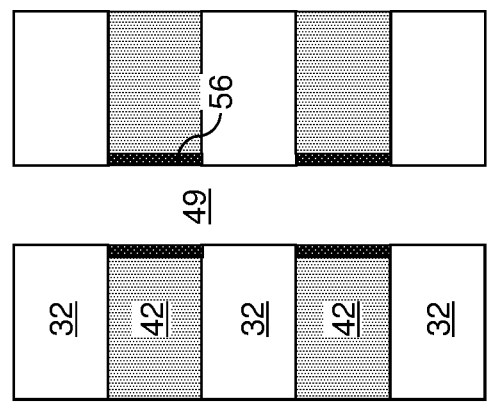

Referring to FIG. 5D, the vertical stack of tubular transition metal element spacers 57 may be optionally converted into a vertical stack of tubular transition metal oxide spacers 56 by oxidation. A thermal oxidation process or a plasma oxidation process may be employed to convert the vertical stack of tubular transition metal element spacers 57 into the vertical stack of tubular transition metal oxide spacers 56. In this case, the vertical stack of tubular transition metal oxide spacers 56 is a vertical stack of tubular transition metal element-containing conductive spacers, and comprises a conductive material (i.e., a conductive oxide) including transition metal element atoms of remaining portions of the transition metal element layer and additionally including oxygen atoms.

In one alternative embodiment, instead of forming the vertical stack of tubular transition metal element spacers 57 in the memory opening 49, a vertical stack of tubular transition metal oxide element spacers 56 is directly formed in the memory opening 49. In this alternative embodiment, metal oxide spacers 56 may be selectively deposited in the annular recesses 45 on exposed surfaces of the sacrificial material layers 42. For example, ruthenium oxide metal oxide spacers 56 may be selectively deposited by selective MOALD in the annular recesses. Alternatively, a metal oxide layer may be conformally deposited in the annular recesses 45 and on physically exposed sidewalls of the insulating layers 32 around each of the memory openings 49, followed by an anisotropic etch of the metal oxide layer to leave the metal oxide spacers 56 in the annular recesses 45.

In another alternative embodiment, conversion of the vertical stack of tubular transition metal element spacers 57 into the vertical stack of tubular transition metal oxide spacers 56 is not performed. In this case, the subsequent exemplary structure includes the vertical stack of tubular transition metal element spacers 57 instead of the vertical stack of tubular transition metal oxide spacers 56.

Referring to FIG. 5E, an optional tubular insulating spacer layer 66 may be formed on the vertical stack of tubular transition metal oxide spacers 56 (or the vertical stack of tubular transition metal element spacers 57) within each memory opening. The tubular insulating spacer layer 66 includes an insulating material layer such as a silicon oxide layer and/or a dielectric metal oxide layer (such as an aluminum oxide layer). The tubular insulating spacer layer 66 may be formed by conformal deposition of an insulating material, for example, by chemical vapor deposition. The thickness of the tubular insulating spacer layer 66 may be in a range from 1 nm to 10 nm, such as from 2 nm to 6 nm, although lesser and greater thicknesses can also be employed. The optional tubular insulating spacer layer 66 may be present, or may be omitted. If the tubular insulating spacer layer 66 is present, an anisotropic etch process may be performed to remove a horizontal bottom portion of the tubular insulating spacer layer 66, and to physically expose a semiconductor surface of the semiconductor material layer 10 at the bottom of each memory opening 49.

Figure 5H:
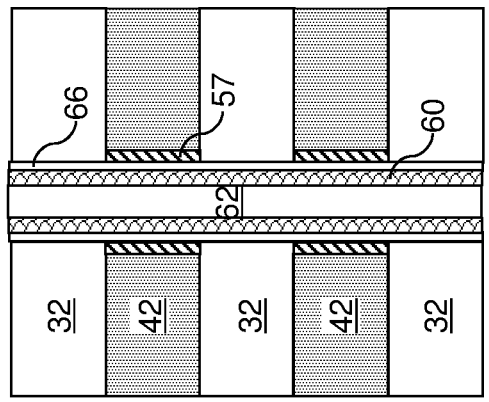
FIG. 5H is a vertical cross-sectional view of an alternative embodiment of the memory opening fill structure according to the first embodiment of the present disclosure.
Figure 5G:
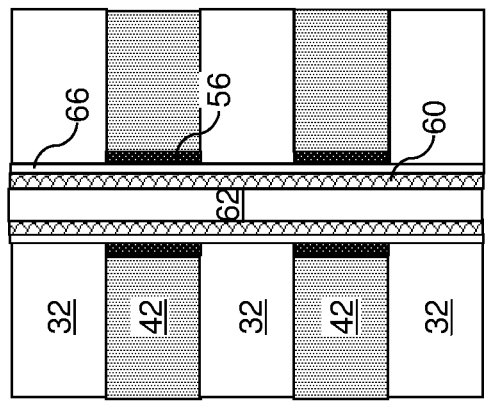
Figure 5F:
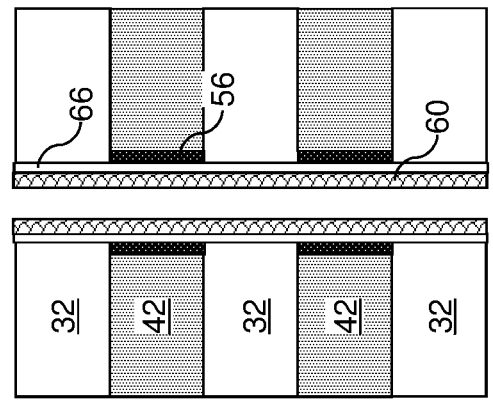

Referring to FIG. 5F, a vertical semiconductor channel 60 may be formed by conformal deposition of a semiconductor channel material on the inner sidewall of the tubular insulating spacer layer 66 (if the tubular insulating spacer layer 66 is present), or on the inner sidewalls of the vertical stack of tubular transition metal element spacers 57 or the vertical stack of tubular transition metal oxide spacers 56 (if the tubular insulating spacer layer 66 is not employed). The vertical semiconductor channel 60 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the vertical semiconductor channel 60 includes polysilicon or amorphous silicon that is subsequently crystallized into polysilicon by annealing. The vertical semiconductor channel 60 may be formed by a conformal deposition method such as low pressure chemical vapor deposition (LPCVD). The vertical semiconductor channel 60 can include electrical dopants of a first conductivity type, which may be p-type or n-type. The atomic concentration of dopants of the first conductivity type in the vertical semiconductor channel 60 may be in a range from $1.0 \times 10^{14}/cm^3$ to $3.0 \times 10^{17}/cm^3$, although lesser and greater dopant concentrations can also be employed. The thickness of the vertical semiconductor channel 60 may be in a range from 2 nm to 10 nm, although lesser and greater thicknesses can also be employed. An optional memory cavity may be formed in the volume of each memory opening 49 that is not filled with the vertical semiconductor channel 60.

Figure 6:
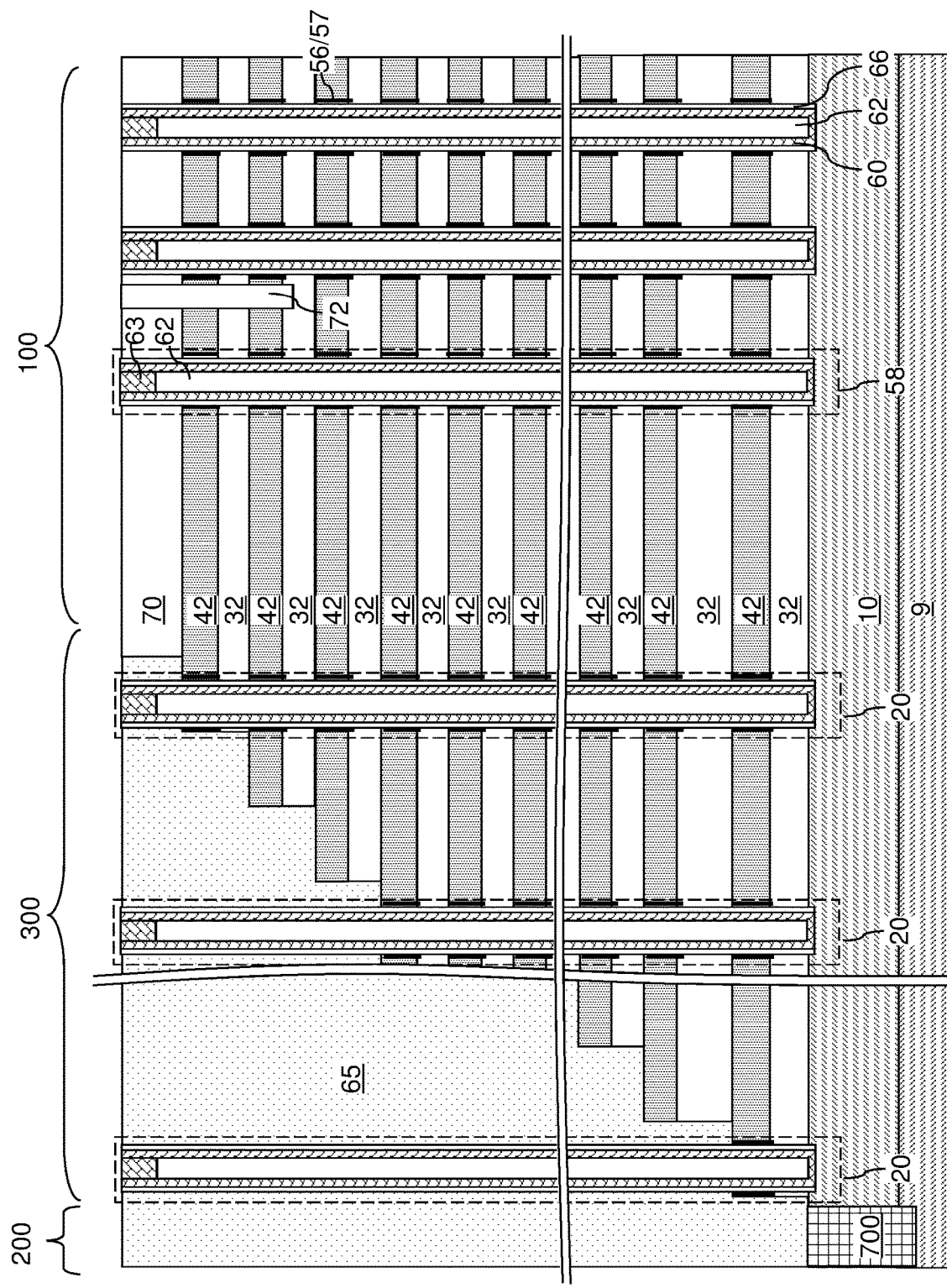
FIG. 6 is a schematic vertical cross-sectional view of the first exemplary structure after formation of memory stack structures and support pillar structures according to the first embodiment of the present disclosure.

Referring to FIG. 5G, an optional dielectric material such as silicon oxide may be deposited in the memory cavity (if present) to form a dielectric core 62. A drain region 63 shown in FIG. 6 is formed by vertically recessing the dielectric core to form a cavity at the level of the insulating cap layer 70, and by filling the cavity with a doped semiconductor material including dopants of a second conductivity type. The second conductivity type is the opposite of the first conductivity type. The atomic concentration of dopants of the second conductivity in the drain regions may be in a range from $5.0 \times 10^{19}/cm^3$ to $2.0 \times 10^{21}/cm^3$, although lesser and greater thicknesses can also be employed. The set of all material portions that fills a memory opening 49 constitutes a memory opening fill structure.

Referring to FIG. 5H, an alternative embodiment of the memory opening fill structure according to the first embodiment of the present disclosure is illustrated, which may be derived from the memory opening fill structure illustrated in FIG. 5G by employing a vertical stack of tubular transition metal element spacers 57 instead of the vertical stack of tubular transition metal oxide spacers 56.

Referring to FIG. 6, the first exemplary structure is illustrated after formation of memory opening fill structures 58 and support pillar structure 20 within the memory openings 49 and the support openings 19, respectively. An instance of a memory opening fill structure 58 may be formed within each memory opening 49 of the structure of FIGS. 4A and 4B. An instance of the support pillar structure 20 may be formed within each support opening 19 of the structure of FIGS. 4A and 4B.

Generally, vertical stacks of tubular transition metal element-containing conductive spacers (56, 57) are formed in the annular recesses of the memory openings 49. Each vertical stack of tubular transition metal element-containing conductive spacers (56, 57) may comprise a vertical stack of tubular transition metal oxide spacers 56 or as a vertical stack of tubular transition metal element spacers 57. The vertical semiconductor channels 60 are formed on inner sidewalls of a respective vertical stack of tubular transition metal element-containing conductive spacers (56, 57) in each of the memory openings 49. The vertical stack of tubular transition metal element-containing conductive spacers (56, 57) may be formed around each of the memory openings prior to formation of the vertical semiconductor channels 60. Each of the tubular transition metal element-containing conductive spacers (56, 57) laterally surrounds a respective one of the vertical semiconductor channels 60.

In one embodiment, the tubular transition metal element-containing conductive spacers comprise tubular transition metal element spacers 57. The metal element spacers 57 comprise and/or consists of a transition metal element that is selected from iridium, ruthenium, palladium, osmium, rhenium, molybdenum or cobalt. In another embodiment, the tubular transition metal element-containing conductive spacers comprise tubular transition metal oxide spacers 56. The metal oxide spacers 56 consist essentially of a conductive oxide of the transition metal element, such as iridium oxide, ruthenium oxide, palladium oxide, osmium oxide, rhenium oxide, molybdenum oxide or cobalt oxide.

In one embodiment, each of the vertical semiconductor channels 60 has a straight outer sidewall that extends through each layer within the alternating stack (32, 42) and contacts a set of sidewalls of the insulating layers 32. In one embodiment, each of the memory opening fill structures 58 can include a vertical stack of the tubular transition metal element-containing conductive spacers (56, 57), the optional tubular insulating spacer layer 66, the vertical semiconductor channel 60, the optional dielectric core 62, and the drain region 63. A support pillar structure 20 can include a vertical stack of the tubular transition metal element-containing conductive spacers (56, 57), the optional tubular insulating spacer layer 66, the vertical semiconductor channel 60, the optional dielectric core 62, and the drain region 63.

Figure 7A:
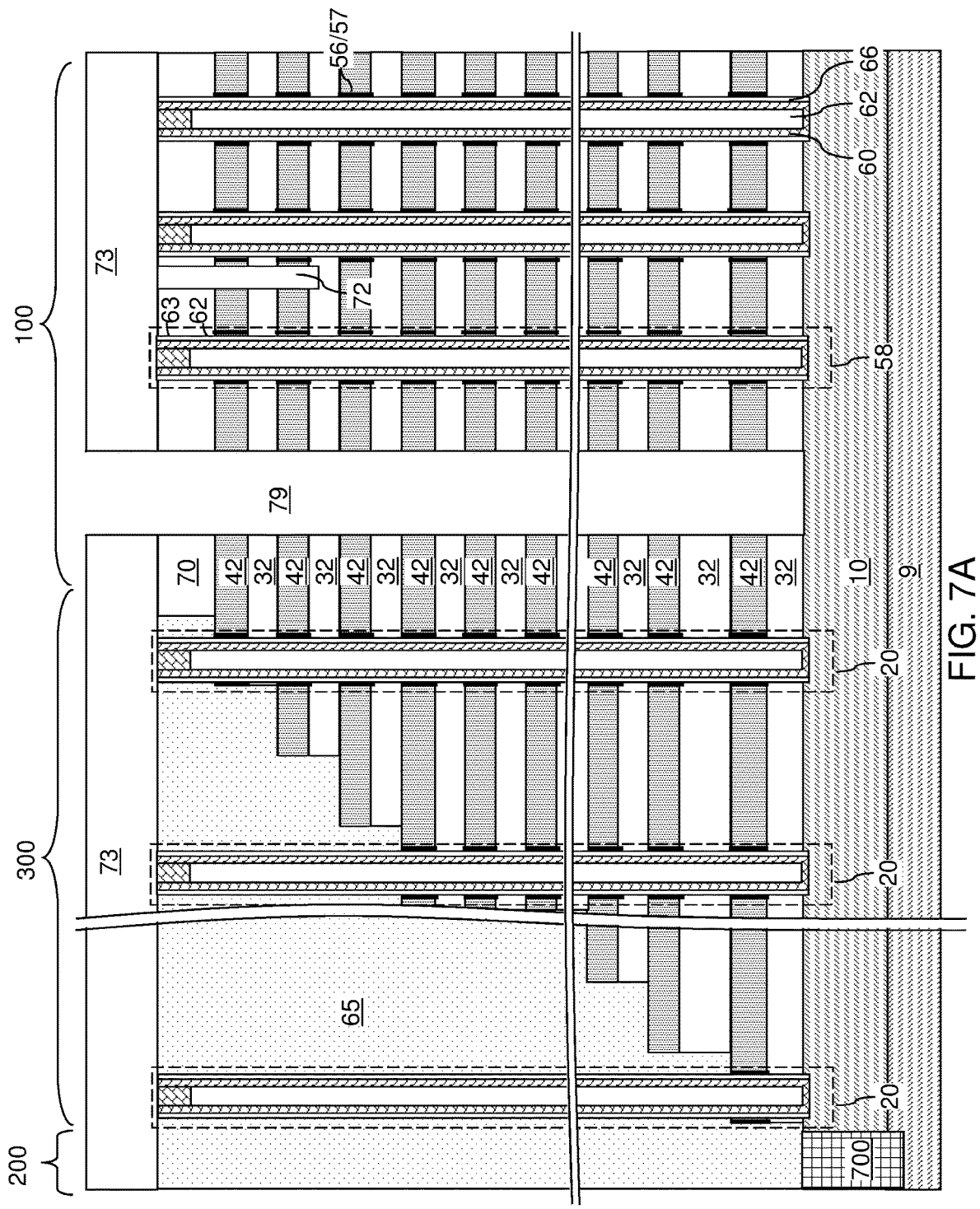
FIG. 7A is a schematic vertical cross-sectional view of the first exemplary structure after formation of backside trenches according to the first embodiment of the present disclosure.
Figure 7B:
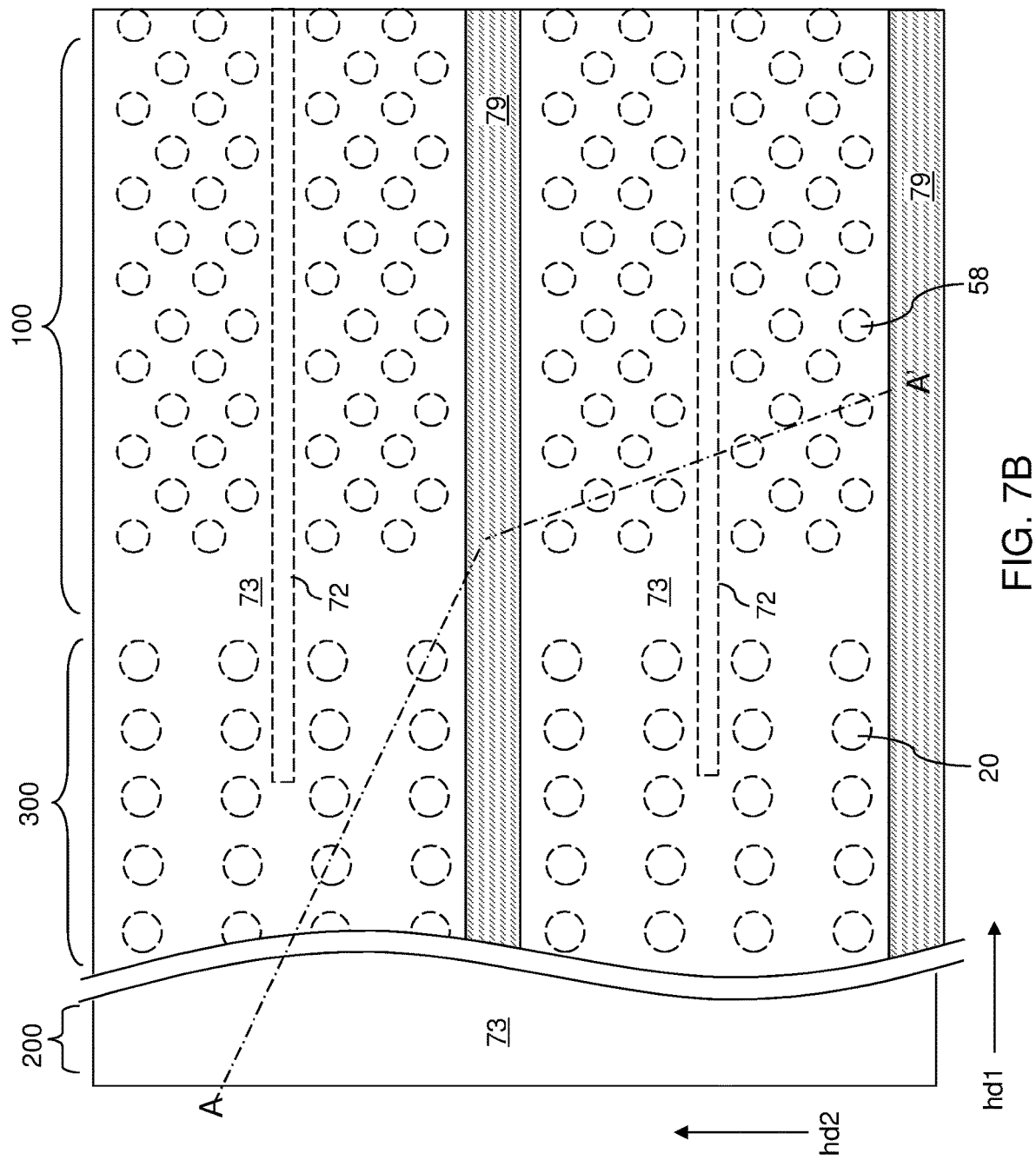
FIG. 7B is a partial see-through top-down view of the first exemplary structure of FIG. 7A. The vertical plane A-A' is the plane of the schematic vertical cross-sectional view of FIG. 7A.

Referring to FIGS. 7A and 7B, a contact level dielectric layer 73 may be formed over the alternating stack (32, 42) of insulating layer 32 and sacrificial material layers 42, and over the memory opening fill structures 58 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) may be applied over the contact level dielectric layer 73, and is lithographically patterned to form openings in areas between clusters of memory opening fill structures 58. The pattern in the photoresist layer may be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the staircase region 300.

In one embodiment, the backside trenches 79 can laterally extend along a first horizontal direction hd1 and may be laterally spaced apart from each other along a second horizontal direction hd2 that is perpendicular to the first horizontal direction hd1. The memory opening fill structures 58 may be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory opening fill structures 58 may be located between a neighboring pair of a backside trench 79 and a drain select level isolation structure 72, or between a neighboring pair of drain select level isolation structures 72. In one embodiment, the backside trenches 79 can include a source contact opening in which a source contact via structure may be subsequently formed. The photoresist layer may be removed, for example, by ashing.

Figure 8:
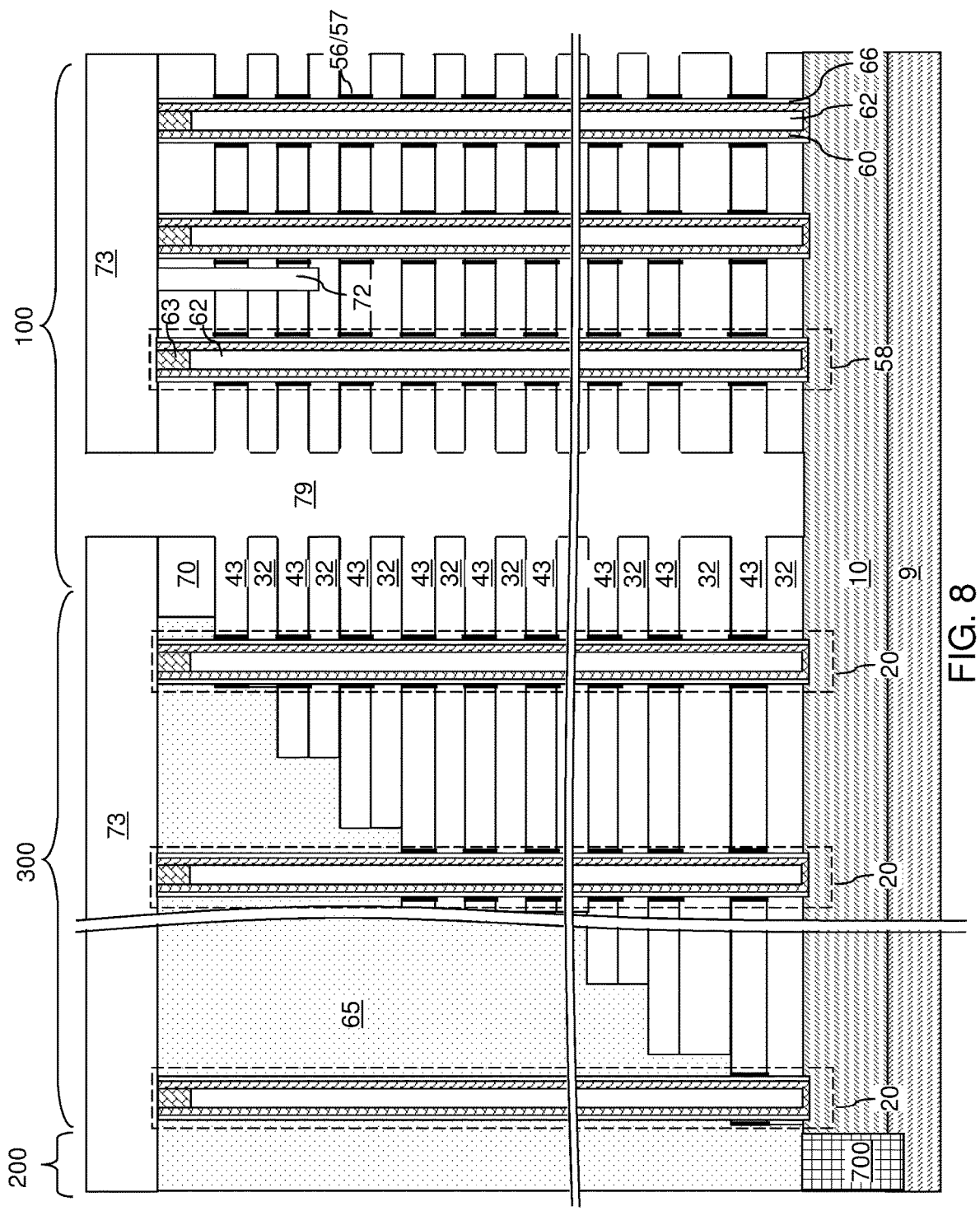
FIG. 8 is a schematic vertical cross-sectional view of the first exemplary structure after formation of backside recesses according to the first embodiment of the present disclosure.
Figure 9C:
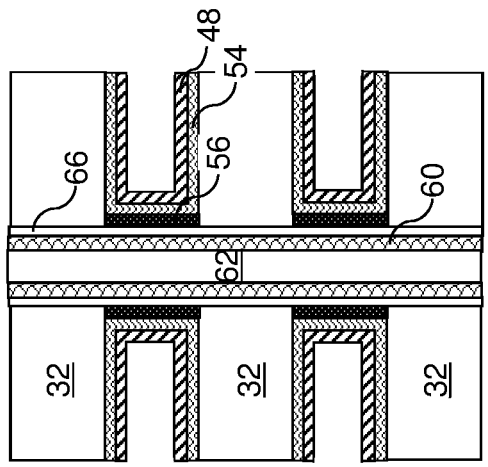
FIGS. 9A-9E are sequential vertical cross-sectional views of a region of the first exemplary structure during formation of electrically conductive layers according to the first embodiment of the present disclosure.
Figure 9B:
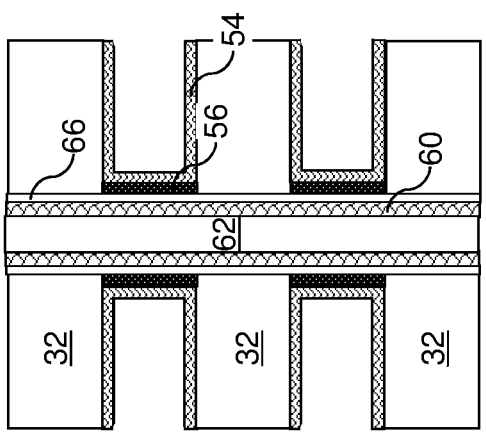
Figure 9A:
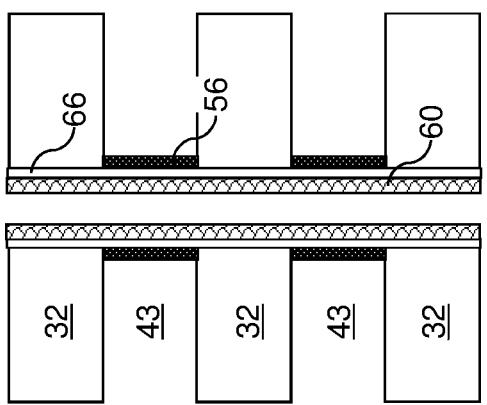

Referring to FIGS. 8 and 9A, an etchant that selectively etches the second material of the sacrificial material layers 42 with respect to the first material of the insulating layers 32 may be introduced into the backside trenches 79, for example, employing an etch process. Backside recesses 43 are formed in volumes from which the sacrificial material layers 42 are removed. The removal of the second material of the sacrificial material layers 42 may be selective to the first material of the insulating layers 32, the material of the retro-stepped dielectric material portion 65, the semiconductor material of the semiconductor material layer 10, and the material of the tubular transition metal element-containing conductive spacers (56, 57). In one embodiment, the sacrificial material layers 42 can include silicon nitride, and the materials of the insulating layers 32 and the retro-stepped dielectric material portion 65 may be selected from silicon oxide and dielectric metal oxides.

The etch process that removes the second material selective to the first material and the tubular transition metal element-containing conductive spacers (56, 57) may be a wet etch process employing a wet etch solution, or may be a gas phase (dry) etch process in which the etchant is introduced in a vapor phase into the backside trenches 79. For example, if the sacrificial material layers 42 include silicon nitride, the etch process may be a wet etch process in which the first exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory opening fill structures 58 provide structural support while the backside recesses 43 are present within volumes previously occupied by the sacrificial material layers 42.

Each backside recess 43 may be a laterally extending cavity having a lateral dimension that is greater than the vertical extent of the cavity. In other words, the lateral dimension of each backside recess 43 may be greater than the height of the backside recess 43. A plurality of backside recesses 43 may be formed in the volumes from which the second material of the sacrificial material layers 42 is removed. The memory openings in which the memory opening fill structures 58 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 may be vertically bounded by a top surface of an underlying insulating layer 32 and a bottom surface of an overlying insulating layer 32. In one embodiment, each backside recess 43 can have a uniform height throughout.

Referring to FIG. 9B, a ferroelectric material layer 54 may be formed as a continuous material layer in the backside recesses 43 and on a sidewall of the backside trench 79. As used herein, a "ferroelectric material" refers to a crystalline material that exhibits spontaneous electrical polarization in the absence of an external electric field. The ferroelectric material in the ferroelectric material layer 54 may be an insulating ferroelectric material. In one embodiment, the ferroelectric material layer 54 comprises an orthorhombic phase hafnium oxide layer, and preferably including at least one dopant selected from Al, Zr, Y, Gd, La, Sr, and Si. Other suitable ferroelectric materials may also be used, such as titanate ferroelectric materials (e.g., barium titanate, lead titanate, lead zirconate titanate, lead lanthanum zirconate titanate ("PLZT"), etc.).

The ferroelectric material layer 54 may be formed on physically exposed surfaces of the insulating layers 32 and outer sidewalls of the tubular transition metal element-containing conductive spacers (56, 57). In one embodiment, the ferroelectric material layer 54 may be deposited by a conformal deposition process such as chemical vapor deposition (CVD) or atomic layer deposition (ALD). The ferroelectric material layer 54 can have a thickness in a range from 2 nm to 40 nm, such as from 4 nm to 15 nm, although lesser and greater thicknesses can also be employed. Alternatively, as will be described below with respect to FIGS. 9I to 9L, the ferroelectric material layer 54 is selectively deposited on the exposed surfaces of the spacers (56, 57) in the backside recesses 43.

Referring to FIG. 9C, a transition metal conductive liner 48 may be deposited on the physically exposed surfaces of the ferroelectric material layer 54. The transition metal conductive liner 48 can consist essentially of at least one transition metal element. As such, the transition metal conductive liner 48 is a transition metal element-containing conductive liner. The transition metal conductive liner 48 can have a thickness in a range from 2 nm to 40 nm, such as from 4 nm to 15 nm, although lesser and greater thicknesses can also be employed.

Figure 9E:
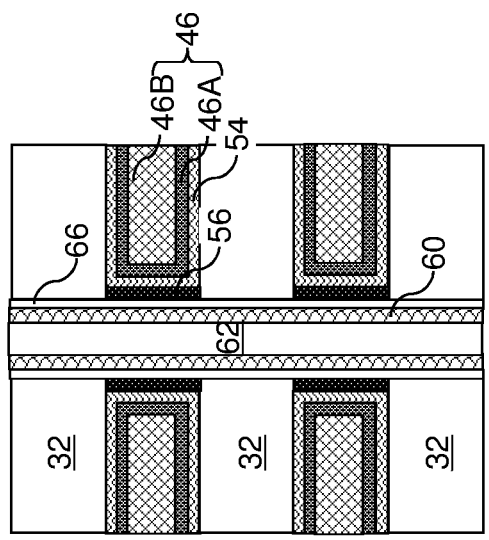
Figure 9D:
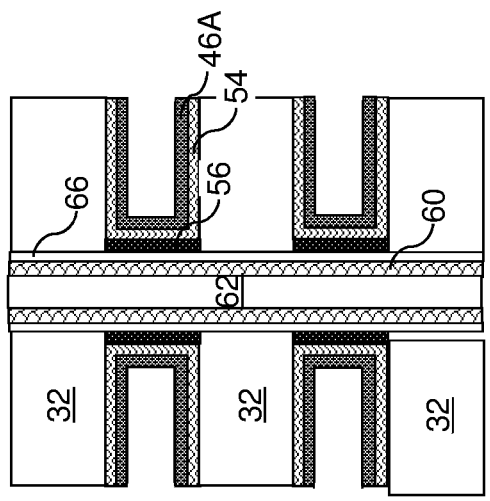

Referring to FIG. 9D, the transition metal conductive liner 48 may be optionally converted into a transition metal oxide conductive layer 46A by oxidation. A thermal oxidation process or a plasma oxidation process may be employed to convert the transition metal conductive liner 48 into the transition metal oxide conductive layer 46A. In this case, the transition metal oxide conductive layer 46A is a transition metal element-containing conductive oxide liner, and comprises a conductive oxide of the transition metal element. The transition metal oxide conductive layer 46A may comprise at least one of iridium oxide, ruthenium oxide, palladium oxide, osmium oxide, rhenium oxide, molybdenum oxide or cobalt oxide.

In one alternative embodiment, the transition metal oxide conductive layer 46A is directly deposited into the backside recesses 43 as a metal oxide layer instead of depositing the transition metal conductive liner 48 followed by oxidation of the transition metal conductive liner 48 into the transition metal oxide conductive layer 46A.

In another alternative embodiment, conversion of the transition metal conductive liner 48 into the transition metal oxide conductive layer 46A is not performed. In this case, the subsequent exemplary structure includes the transition metal conductive liner 48 instead of the transition metal oxide conductive layer 46A.

Figure 10:
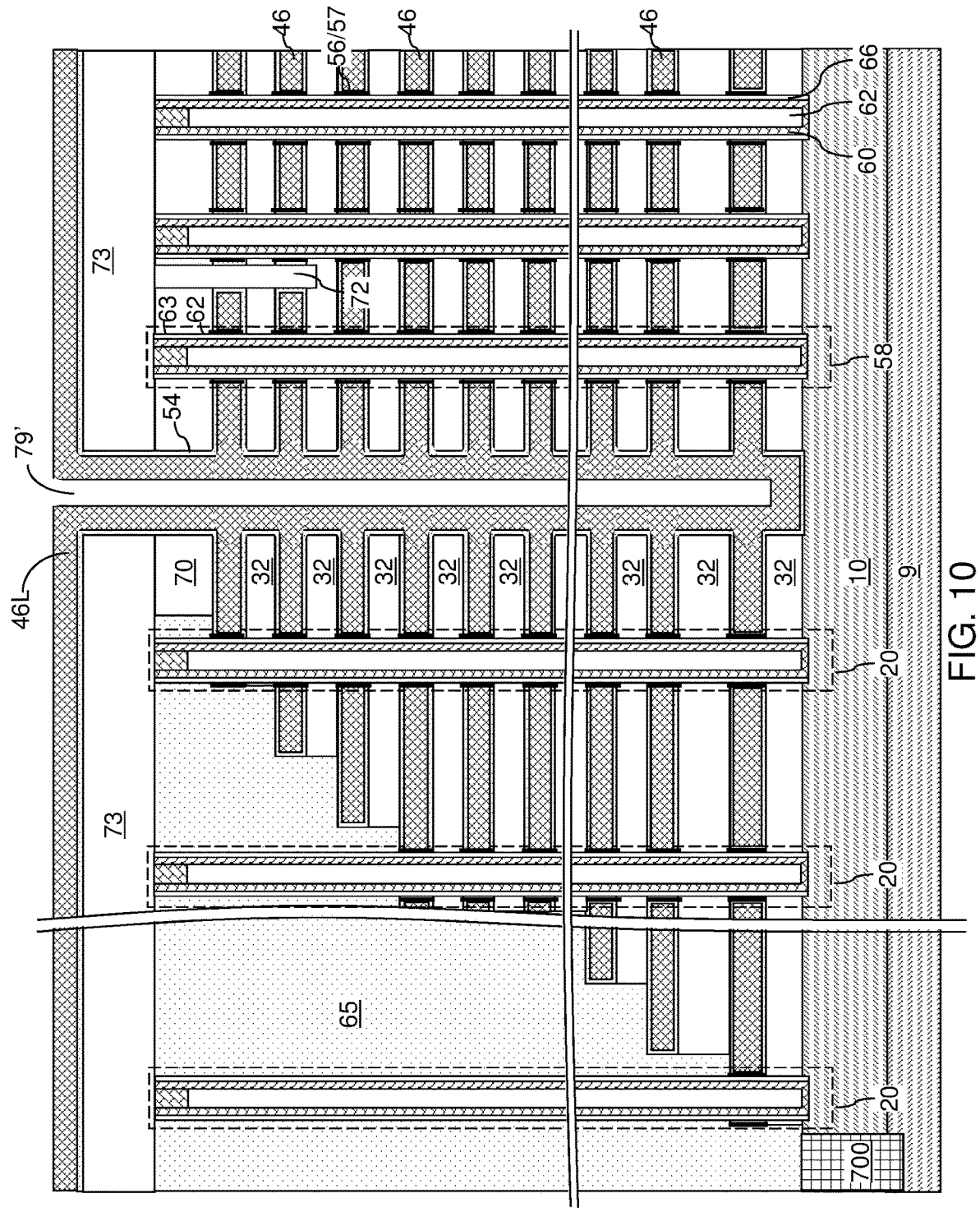
FIG. 10 is a schematic vertical cross-sectional view of the first exemplary structure at the processing step of FIG. 9D.

Referring to FIGS. 9E and 10, a metal fill material is deposited in remaining volumes of the plurality of backside recesses 43, on the sidewalls of the at least one the backside trench 79, and over the top surface of the contact level dielectric layer 73 to form a conductive fill material layer 46B. The metallic fill material may be deposited by a conformal deposition method, which may be, for example, chemical vapor deposition (CVD), atomic layer deposition (ALD), electroless plating, electroplating, or a combination thereof. In one embodiment, the conductive fill material layer 46B can consist essentially of at least one elemental metal. The at least one elemental metal of the conductive fill material layer 46B may be selected, for example, from tungsten, molybdenum, cobalt, ruthenium, titanium, and tantalum. In one embodiment, the conductive fill material layer 46B can consist essentially of a single elemental metal. In one embodiment, the conductive fill material layer 46B may be deposited employing a fluorine-containing precursor gas such as $WF_6$. In one embodiment, the conductive fill material layer 46B may be a tungsten layer including a residual level of fluorine atoms as impurities. The conductive fill material layer 46B is spaced from the insulating layers 32 and the memory opening fill structures 58 by the transition metal oxide conductive layer 46A.

Each portion of the transition metal oxide conductive layer 46A and the conductive fill material layer 46B that is located within a backside recess 43 constitutes an electrically conductive layer 46. A plurality of electrically conductive layers 46 may be formed in the plurality of backside recesses 43, and a continuous electrically conductive layer 46L may be formed on the sidewalls of each backside trench 79 and over the contact level dielectric layer 73. Each electrically conductive layer 46 includes a portion of the transition metal oxide conductive layer 46A and a portion of the conductive fill material layer 46B that are located between a vertically neighboring pair of dielectric material layers such as a pair of insulating layers 32. The continuous electrically conductive layer 46L includes a continuous portion of the transition metal oxide conductive layer 46A and a continuous portion of the conductive fill material layer 46B that are located in the backside trenches 79 or above the contact level dielectric layer 73. Each sacrificial material layer 42 may be replaced with an electrically conductive layer 46. A backside cavity 79' is present in the portion of each backside trench 79 that is not filled with the ferroelectric material layer 54 and the continuous electrically conductive layer 46L.

FIGS. 9F-9O illustrate various alternative embodiments of the exemplary structure illustrated in FIG. 9E.

The alternative embodiment illustrated in FIG. 9F may be derived from the embodiment illustrated in FIG. 9E by employing a vertical stack of tubular transition metal element spacers 57 as a vertical stack of tubular transition metal element-containing conductive spacers instead of the metal oxide spacers 56.

The alternative embodiment illustrated in FIG. 9G may be derived from the embodiment illustrated in FIG. 9E by employing the transition metal conductive liner 48 instead of the transition metal oxide conductive layer 46A.

The alternative embodiment illustrated in FIG. 9H may be derived from the embodiment illustrated in FIG. 9F by employing the transition metal conductive liner 48 instead of the transition metal oxide conductive layer 46A.

Figures 9I, 9J:
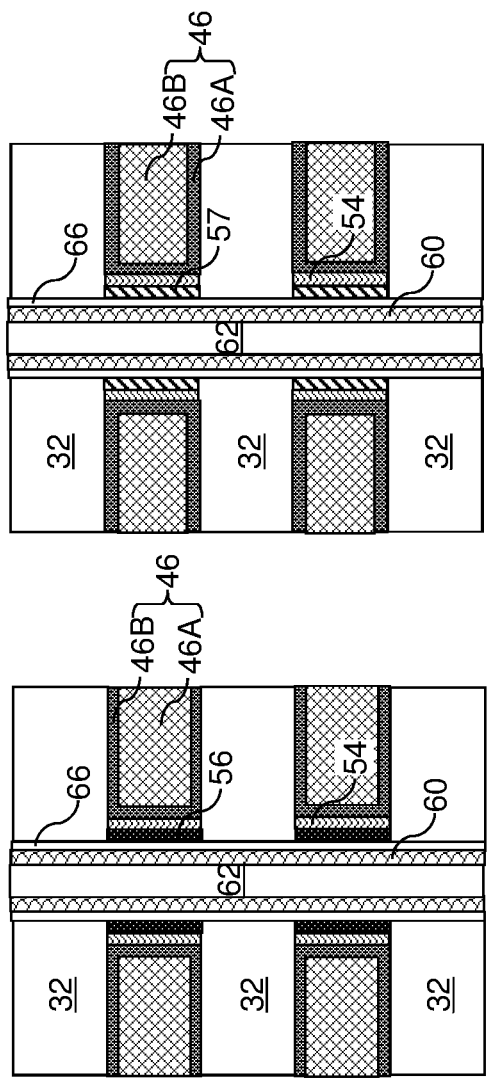

The alternative embodiment illustrated in FIG. 9I may be derived from the embodiment illustrated in FIG. 9E by forming the ferroelectric material layer 54 as a plurality of ferroelectric material layers 54 having a respective cylindrical configuration employing a selective ferroelectric material deposition process that deposits a ferroelectric material only on physically exposed surfaces of the vertical stack of tubular transition metal oxide spacers 56.

The alternative embodiment illustrated in FIG. 9J may be derived from the embodiment illustrated in FIG. 9F by forming the ferroelectric material layer 54 as a plurality of ferroelectric material layers 54 having a respective cylindrical configuration employing a selective ferroelectric material deposition process that deposits a ferroelectric material only on physically exposed surfaces of the vertical stack of tubular transition metal element spacers 57.

Any suitable selective deposition process may be used in the embodiments of FIGS. 9I and 9J. For example, the exposed surfaces of the insulating layers 32 may be selectively coated with an organic self-assembled monolayer, which does not form on the conductive spacers (56, 57). The ferroelectric material layers 54 are then selectively deposited on the exposed surfaces of the conductive spacers (56, 57) but are not deposited on the monolayer coating the insulating layers 32.

The alternative embodiment illustrated in FIG. 9K may be derived from the embodiment illustrated in FIG. 9I by employing the transition metal conductive liner 48 instead of the transition metal oxide conductive layer 46A.

The alternative embodiment illustrated in FIG. 9L may be derived from the embodiment illustrated in FIG. 9J by employing the transition metal conductive liner 48 instead of the transition metal oxide conductive layer 46A.

The alternative embodiment illustrated in FIG. 9M may be derived from the embodiment illustrated in FIG. 9E by employing a combination of a transition metal oxide conductive layer 46A and a transition metal conductive liner 48 in lieu of the single transition metal oxide conductive layer 46A. In this case, a first transition metal conductive liner may be deposited at the processing step of FIG. 9C, and can be converted into a transition metal oxide conductive layer 46A at the processing step of FIG. 9D. Subsequently, a second transition metal conductive liner 48 can be deposited prior to deposition of conductive fill material layer 46B to provide the structure illustrated in FIG. 9M.

The alternative embodiment illustrated in FIG. 9N can be derived from the embodiment illustrated in FIG. 9F by partially oxidizing outer surface portions of each of the transition metal element spacers 57 into a transition metal oxide material. In this case, each remaining portion of the transition metal element spacer 57 can have a tubular configuration, and can be laterally surrounded by a respective tubular transition metal oxide spacer 56. Subsequently, a ferroelectric material layer 54 can be deposited on each tubular transition metal oxide spacer 56.

The alternative embodiment illustrated in FIG. 9O may be derived from the embodiment illustrated in FIG. 9N by employing a combination of a transition metal oxide conductive layer 46A and a transition metal conductive liner 48 shown in FIG. 9M. In this case, a first transition metal conductive liner may be deposited on the ferroelectric material layers 54, and can be converted into a transition metal oxide conductive layer 46A. Subsequently, a second transition metal conductive liner 48 can be deposited prior to deposition of conductive fill material layer 46B to provide the structure illustrated in FIG. 9O. In this embodiment, the ferroelectric material layers 54 is located between an inner bilayer comprising the transition metal element spacer 57 and the tubular transition metal oxide spacer 56, and an outer bilayer of the transition metal oxide conductive layer 46A and the second transition metal conductive liner 48. Each ferroelectric material layer 54 contacts the metal oxide materials of the tubular transition metal oxide spacer 56 and the transition metal oxide conductive layer 46A on its respective inner and outer surfaces.

Figure 11A:
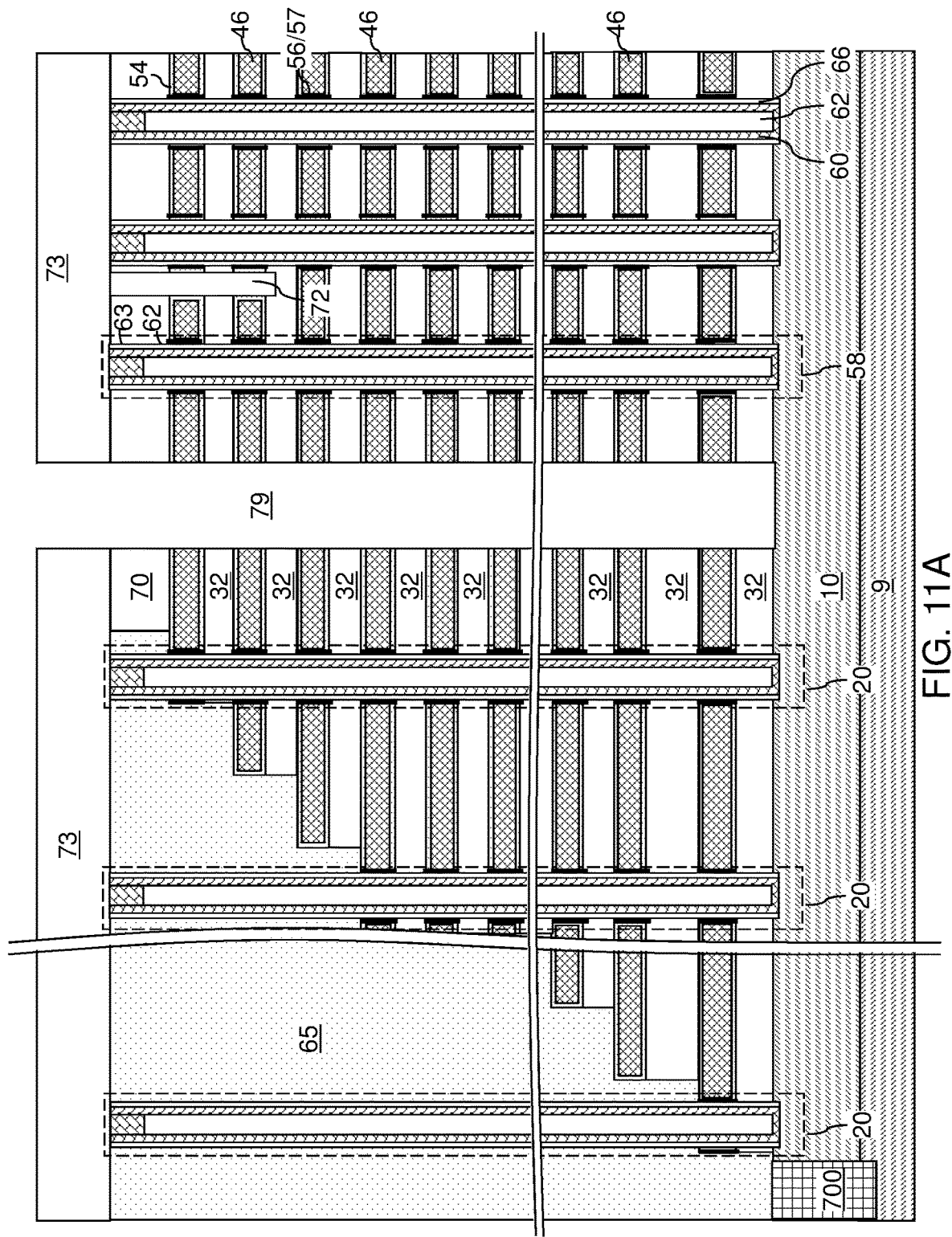
FIG. 11A is a schematic vertical cross-sectional view of the first exemplary structure after removal of a deposited conductive material from within the backside trench according to the first embodiment of the present disclosure.
Figure 11B:
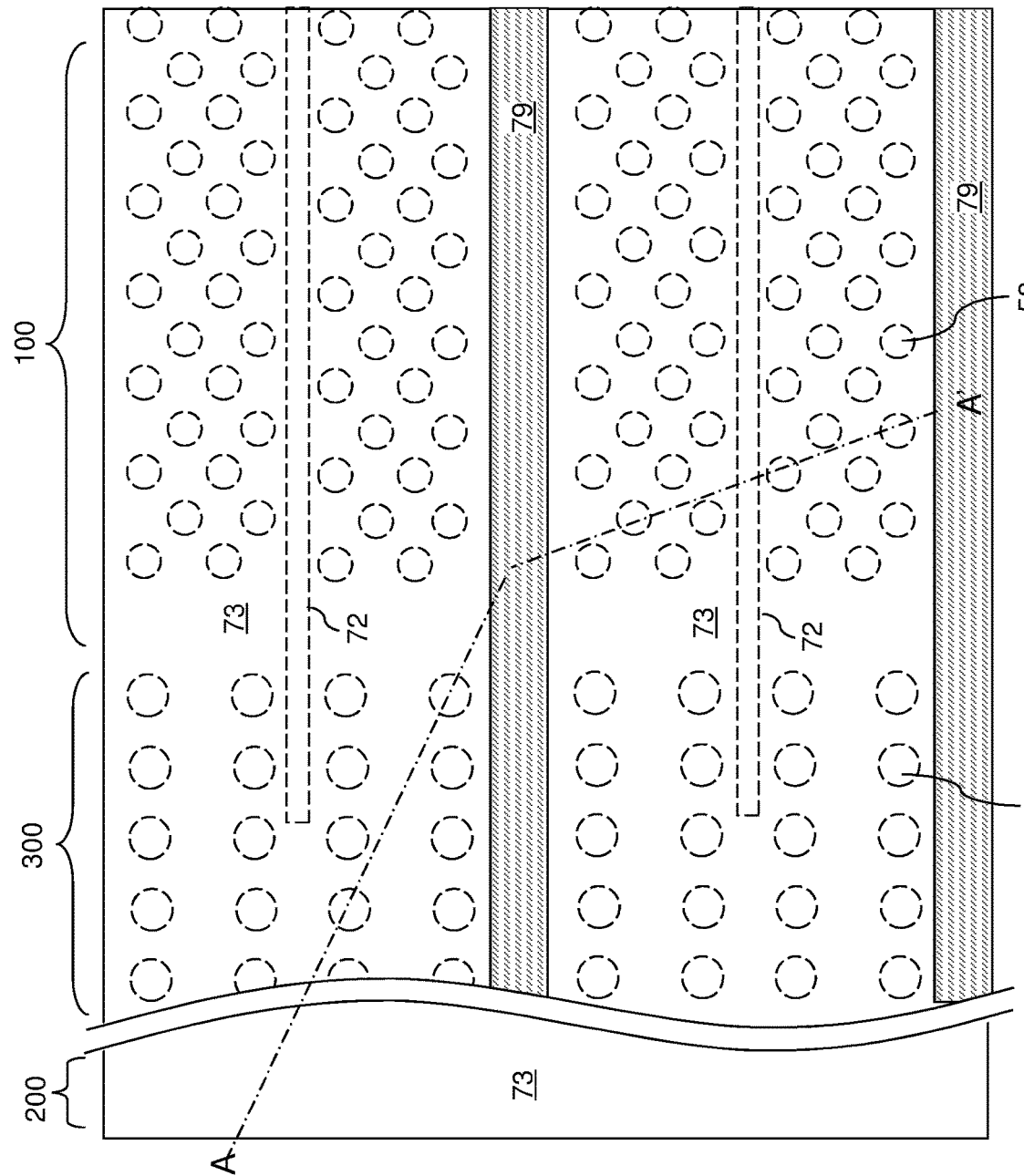
FIG. 11B is a partial see-through top-down view of the first exemplary structure of FIG. 11A. The vertical plane A-A' is the plane of the schematic vertical cross-sectional view of FIG. 11A.

Referring to FIGS. 11A and 11B, the deposited metallic material of the continuous electrically conductive layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 may be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory opening fill structures 58. In other words, each electrically conductive layer 46 may be a word line that functions as a common control gate electrode for the plurality of vertical memory devices.

In one embodiment, the removal of the continuous electrically conductive layer 46L may be selective to the material of the ferroelectric material layer 54. In this case, a horizontal portion of the ferroelectric material layer 54 may be present at the bottom of each backside trench 79. In another embodiment, the removal of the continuous electrically conductive layer 46L may not be selective to the material of the ferroelectric material layer 54. A backside cavity 79' is present within each backside trench 79.

Generally, each of the electrically conductive layers 46 comprises and a conductive fill material portion (comprising a portion of a conductive fill material layer 46B) embedded within the transition metal element-containing conductive liner (46A, 48), which may comprise a transition metal conductive liner 48 or a transition metal oxide conductive layer 46A. The transition metal element-containing conductive liner (46A, 48) comprises a transition metal element that is selected from iridium, ruthenium, palladium, osmium, rhenium, molybdenum or cobalt. In one embodiment, the transition metal element-containing conductive liner (46A, 48) may comprise a transition metal oxide conductive layer 46A, and can consist essentially of a conductive oxide of the transition metal element. In another embodiment, the transition metal element-containing conductive liner (46A, 48)

may comprise a transition metal conductive liner 48, and can consist essentially of the transition metal element.

In some embodiments, a ferroelectric material layer 54 within a backside recess 43 comprises: an upper horizontally-extending portion that contacts a bottom surface of the respective overlying one of the insulating layers 32 and a top surface of a respective electrically conductive layer 46, a lower horizontally-extending portion that contacts a top surface of the respective underlying one of the insulating layers 32 and a bottom surface of the respective electrically conductive layer 46, and a tubular portion vertically extending between the upper horizontally-extending portion and the lower horizontally-extending portion. In this case, each of the plurality of tubular portions laterally surrounds, and contacts, a respective one of the tubular transition metal element-containing conductive spacers (56, 57). Alternatively, if the ferroelectric material layer 54 is selectively deposited on the spacers (56, 57), then the ferroelectric material layer 54 comprises only the tubular portion in each backside recess 43.

In one embodiment, each of the memory opening fill structures 58 comprises a vertical semiconductor channel 60 and a vertical stack of tubular transition metal element-containing conductive spacers (56, 57) laterally surrounding the vertical semiconductor channel 60 and located at levels of the electrically conductive layers 46. Each of the electrically conductive layers 46 is laterally spaced from each of the vertical stacks of tubular transition metal element-containing conductive spacers (56, 57) and may be optionally vertically spaced from a respective overlying one of the insulating layers 32 and a respective underlying one of the insulating layers 32 by a ferroelectric material layer 54. In one embodiment, each of the tubular transition metal element-containing conductive spacers (56, 57) has an inner cylindrical sidewall that contacts a portion of an outer sidewall of a respective vertical semiconductor channel 60.

Figure 12:
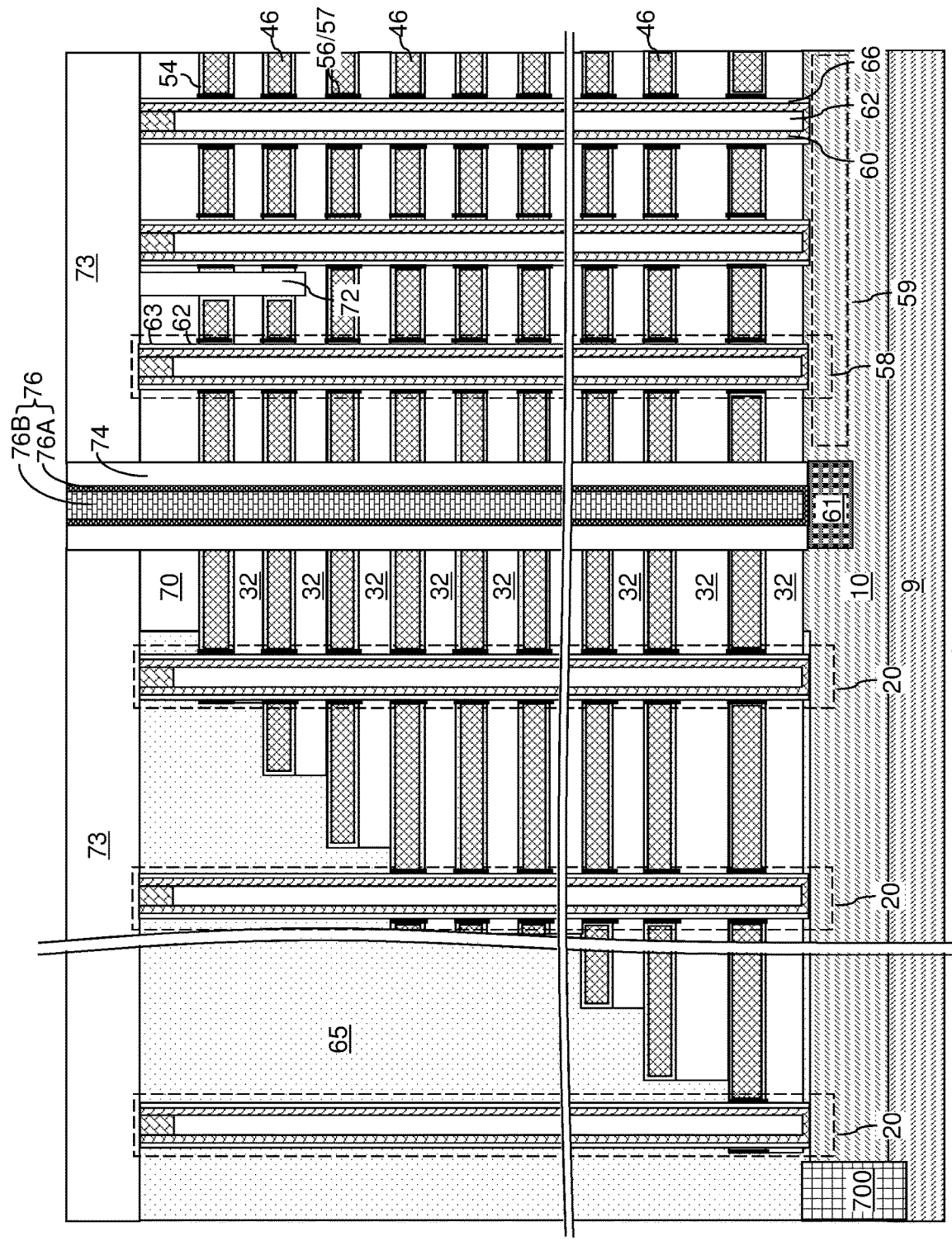
FIG. 12 is a schematic vertical cross-sectional view of the first exemplary structure after formation of an tubular insulating spacer and a backside contact structure according to the first embodiment of the present disclosure.

Referring to FIG. 12, an insulating material layer may be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer may be formed, for example, by low pressure chemical vapor deposition (LPCVD) or atomic layer deposition (ALD). The thickness of the insulating material layer may be in a range from 1.5 nm to 60 nm, although lesser and greater thicknesses can also be employed.

An anisotropic etch is performed to remove horizontal portions of the insulating material layer from above the contact level dielectric layer 73 and at the bottom of each backside trench 79. Each remaining portion of the insulating material layer constitutes an tubular insulating spacer 74. A backside cavity 79' is present within a volume surrounded by each tubular insulating spacer 74. A top surface of the semiconductor material layer 10 may be physically exposed at the bottom of each backside trench 79.

A source region 61 may be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the tubular insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the tubular insulating spacer 74.

An upper portion of the semiconductor material layer 10 that extends between the source region 61 and the vertical semiconductor channels 60 constitutes a horizontal semiconductor channel 59 for a plurality of field effect transistors. The horizontal semiconductor channel 59 connects the source region 61 to multiple vertical semiconductor channels 60. One or more bottommost electrically conductive layers 46 provided upon formation of the electrically conductive layers 46 within the alternating stack (32, 46) may comprise source select gate electrode(s) for a vertical ferroelectric NAND string. One or more topmost electrically conductive layers 46 provided upon formation of the electrically conductive layers 46 within the alternating stack (32, 46) may comprise drain select gate electrode(s) for the vertical ferroelectric NAND string. The electrically conductive layers 46 between the source and the drain select gate electrodes comprise control gates/word lines for the vertical ferroelectric NAND string. Each source region 61 is formed in an upper portion of the substrate (9, 10). Semiconductor channels (59, 60) extend between each source region 61 and a respective set of drain regions 63. The semiconductor channels (59, 60) include the vertical semiconductor channels 60 of the memory opening fill structures 58.

A backside contact via structure 76 may be formed within each backside cavity 79'. Each contact via structure 76 can fill a respective backside cavity 79'. The contact via structures 76 may be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A may be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material may be planarized employing the contact level dielectric layer 73 overlying the alternating stack (32, 46) as a stopping layer. If chemical mechanical planarization (CMP) process is employed, the contact level dielectric layer 73 may be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a ferroelectric material layer 54 is employed, the backside contact via structure 76 can contact a sidewall of the ferroelectric material layer 54.

Figure 13A:
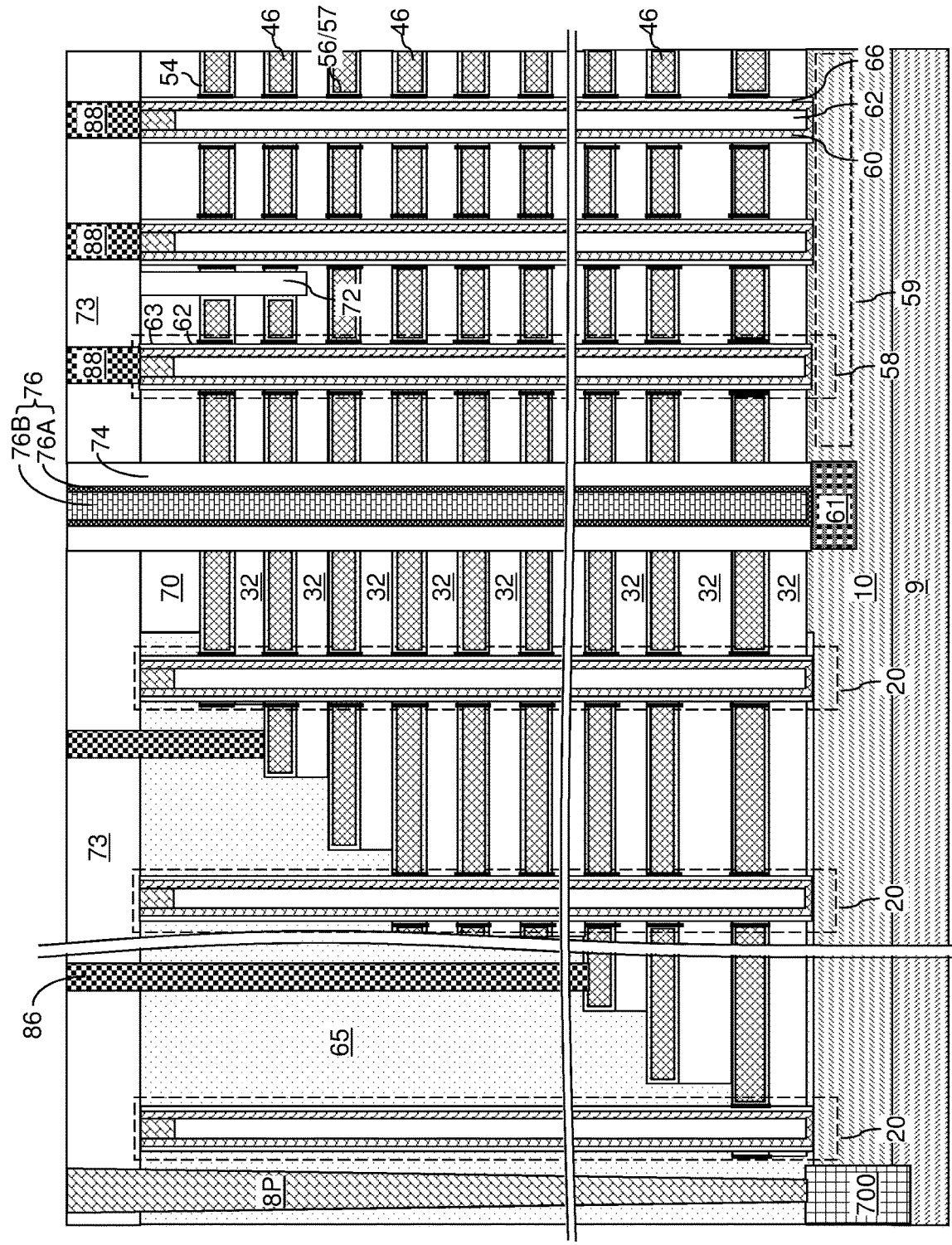
FIG. 13A is a schematic vertical cross-sectional view of the first exemplary structure after formation of additional contact via structures according to the first embodiment of the present disclosure.
Figure 13B:
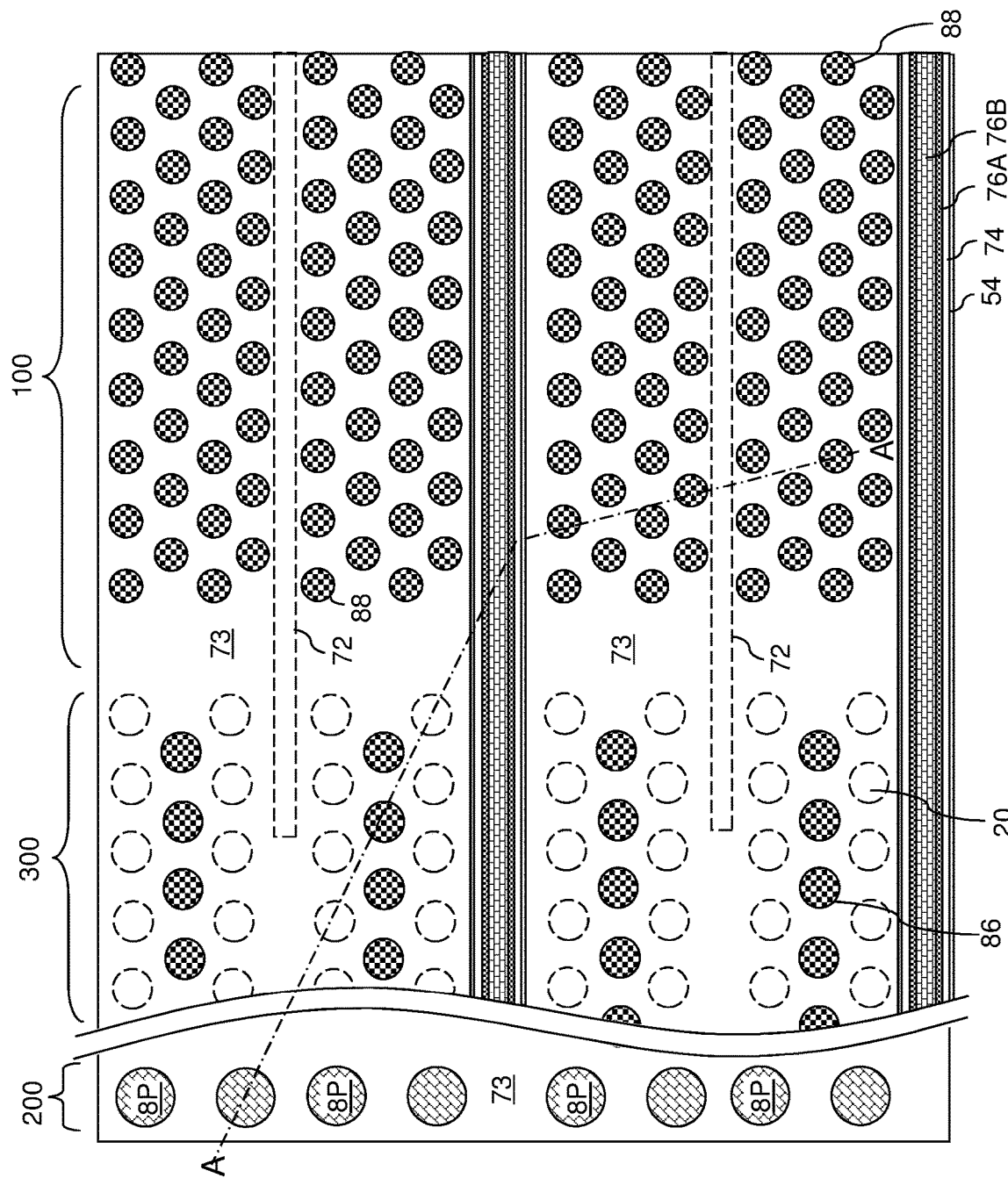
FIG. 13B is a top-down view of the first exemplary structure of FIG. 13A. The vertical plane A-A' is the plane of the schematic vertical cross-sectional view of FIG. 13A.

Referring to FIGS. 13A and 13B, additional contact via structures (88, 86, 8P) may be formed through the contact level dielectric layer 73, and optionally through the retro-stepped dielectric material portion 65. For example, drain contact via structures 88 may be formed through the contact level dielectric layer 73 on each drain region 63. Word line contact via structures 86 may be formed on the electrically conductive layers 46 through the contact level dielectric layer 73, and through the retro-stepped dielectric material portion 65. Peripheral device contact via structures 8P may be formed through the retro-stepped dielectric material portion 65 directly on respective nodes of the peripheral devices. In one alternative embodiment, the peripheral devices 700 are formed on a separate substrate and then bonded to the memory devices. In that case, the peripheral device contact via structures 8P may be omitted. In another alternative embodiment, the peripheral devices 700 may be formed underneath the alternating stack (32, 46). In that case, a horizontal source line may be provided in contact with a side of the vertical semiconductor channels 60 and the peripheral device contact via structures 8P may extend through the alternating stack (32, 46).

Figure 14C:
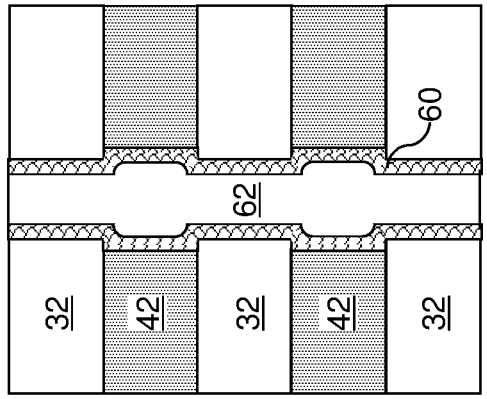
FIGS. 14A-14C are sequential vertical cross-sectional views of a region of a second exemplary structure during formation of a memory opening fill structure according to a second embodiment of the present disclosure.
Figure 14B:
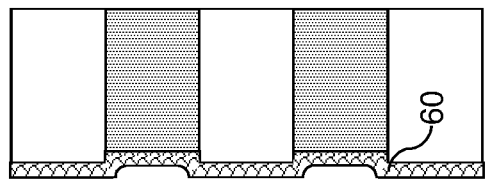
Figure 14A:
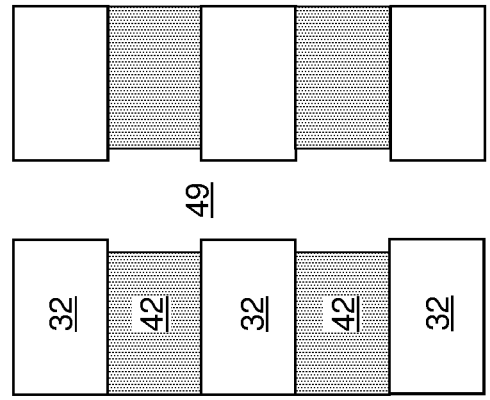

FIGS. 14A-14C are sequential vertical cross-sectional views of a region of a second exemplary structure during formation of a memory opening fill structure according to a second embodiment of the present disclosure.

Referring to FIG. 14A, a memory opening 49 according to the second embodiment of the present disclosure is shown at the processing step of FIG. 5B.

Referring to FIG. 14B, the vertical semiconductor channel 60 may be formed by conformal deposition of a semiconductor channel material on the sidewalls of the alternating stack (32, 42) using the deposition step of FIG. 5F described above. The vertical semiconductor channel 60 fills the annular recesses 45.

Referring to FIG. 14C, the optional dielectric material such as silicon oxide may be deposited in the memory cavity to form a dielectric core 62 and a drain region shown in FIG. 6 is may be formed by vertically recessing the dielectric core to form a cavity at the level of the insulating cap layer 70, and by filling the cavity with a doped semiconductor material including dopants of a second conductivity type. The set of all material portions that fills a memory opening 49 constitutes a memory opening fill structure 58. Thus, the memory opening fill structure 58 is formed within each memory opening 49.

Figure 15A:
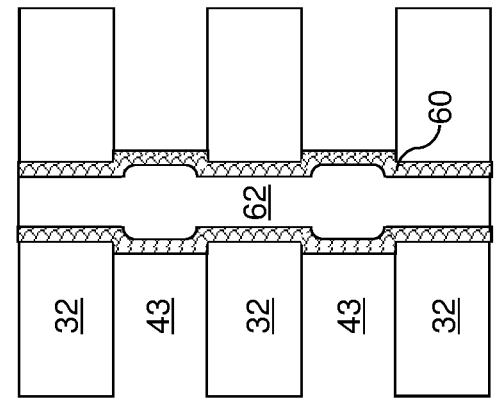
FIGS. 15A-15H are sequential vertical cross-sectional views of a region of the second exemplary structure during formation of backside recesses, tubular insulating spacers, tubular transition metal element-containing conductive spacers, a ferroelectric material layer, and electrically conductive layers each including a respective transition metal element-containing conductive liner according to the second embodiment of the present disclosure.

The processing steps of FIGS. 7A and 7B, 8, and 9A may be subsequently performed to provide a structure illustrated in FIG. 15A. The isotropic etch process employed to form the backside recesses 43 can employ an etch chemistry that etches the material of the sacrificial material layers 42 selective to the materials of the insulating layers 32 and the vertical semiconductor channel 60. For example, if the sacrificial material layers 42 include silicon nitride, the etch process may be a wet etch process in which the first exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory opening fill structures 58 provide structural support while the backside recesses 43 are present within volumes previously occupied by the sacrificial material layers 42.

Figure 15B:
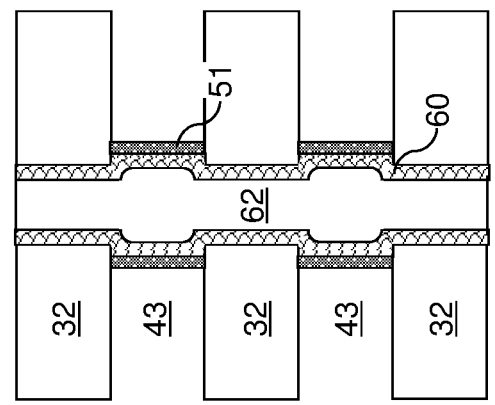

Referring to FIG. 15B, a tubular insulating spacer 51 may be optionally formed on the physically exposed surfaces of the vertical semiconductor channel 60. The tubular insulating spacer 51 includes a dielectric material such as silicon nitride or a dielectric metal oxide. For example, silicon nitride may be selectively deposited on the physically exposed outer sidewalls of the vertical semiconductor channel 60 by performing a conformal silicon nitride deposition process (such as a low pressure chemical vapor deposition process) that has a shorter incubation time on semiconductor surfaces than on dielectric surfaces (such as silicon oxide surfaces of the insulating layers 32). The duration of the deposition step of the conformal silicon nitride deposition process may be shorter than the incubation time for silicon nitride on the surfaces of the insulating layers. In this case, the tubular insulating spacers 51 having a respective cylindrical shape may be formed around each physically exposed cylindrical surface portion of the vertical semiconductor channel 60. A vertical stack of tubular insulating spacers 51 may be formed on the outer sidewall of the vertical semiconductor channel 60 at each level of the backside recesses 43. The thickness of each tubular insulating spacer 51 may be in a range from 1 nm to 10 nm, such as from 2 nm to 6 nm, although lesser and greater thicknesses can also be employed.

Figure 15C:
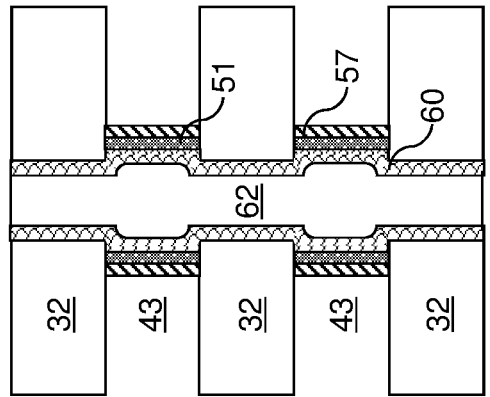

Referring to FIG. 15C, a transition metal element material may be selectively deposited on physically exposed sidewalls of the tubular insulating spacers 51. A selective transition metal element deposition process may be employed, in which the transition metal element material grows only from the physically exposed surfaces of the tubular insulating spacers 51, and does not grow from surfaces of the insulating layers 32. In one embodiment, the selective transition metal element deposition process can employ MOALD using a metal organic precursor that nucleates on silicon nitride surfaces of the tubular insulating spacers 51 and does not nucleate on silicon oxide surfaces of the insulating layers 32.

The transition metal element material can consist essentially of at least one transition metal element that is capable of forming a conductive metal oxide. In one embodiment, the transition metal element material can consist essentially of a single transition metal element that is capable of forming a conductive metal oxide. In one embodiment, the transition metal element material can consist essentially of at least one transition metal element (such as a single transition metal element) that is selected from iridium, ruthenium, palladium, osmium, rhenium, molybdenum or cobalt.

The vertical stack of tubular transition metal element spacers 57 may be formed on the vertical stack of tubular insulating spacers 51. The vertical stack of tubular transition metal element spacers 57 can consist essentially of at least one transition metal element. The lateral thickness of each tubular transition metal element spacers 57 may be in a range from 2 nm to 30 nm, such as from 4 nm to 15 nm, although lesser and greater thicknesses can also be employed. Alternatively, metal oxide spacers 56 may be directly deposited instead of the transition metal element spacers 57.

Figure 15F:
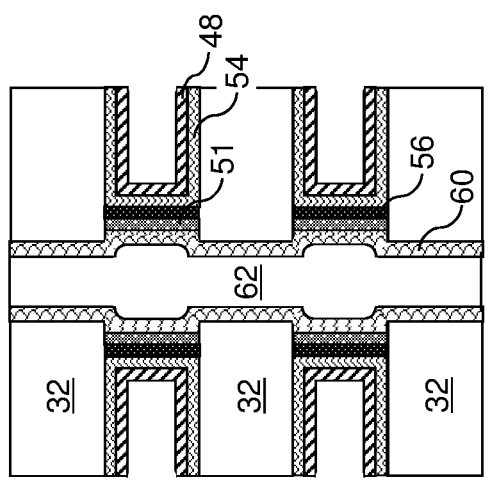
Figure 15E:
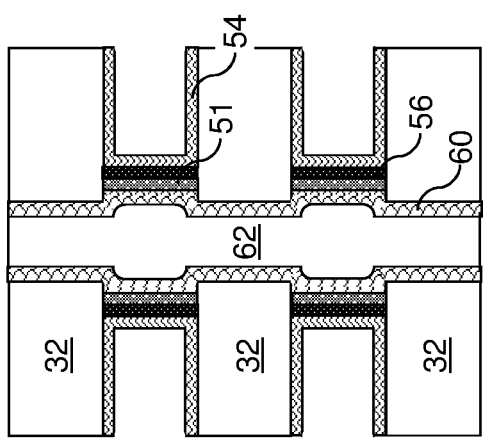
Figure 15D:
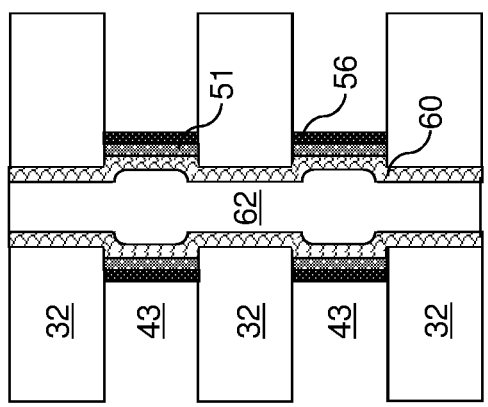

Referring to FIG. 15D, the vertical stack of tubular transition metal element spacers 57 may be optionally converted into a vertical stack of tubular transition metal oxide spacers 56 by oxidation. A thermal oxidation process or a plasma oxidation process may be employed to convert the vertical stack of tubular transition metal element spacers 57 into the vertical stack of tubular transition metal oxide spacers 56 described above. In an alternative embodiment, conversion of the vertical stack of tubular transition metal element spacers 57 into the vertical stack of tubular transition metal oxide spacers 56 is not performed. In this case, the subsequent exemplary structure includes the vertical stack of tubular transition metal element spacers 57 instead of the vertical stack of tubular transition metal oxide spacers 56. In another embodiment, the transition metal element spacers 57 can also be optionally partially converted to a transition metal oxide (hence forming a bilayer).

Referring to FIG. 15E, the processing steps of FIG. 9B may be performed to form a ferroelectric material layer 54 in each backside recess 43 and directly on physically exposed outer sidewalls of the vertical stacks of tubular transition metal element-containing conductive spacers (56, 57).

Referring to FIG. 15F, the processing steps of FIG. 9C may be performed to deposit a transition metal conductive liner 48 on the physically exposed surfaces of the ferroelectric material layer 54. The transition metal conductive liner 48 can have a thickness in a range from 2 nm to 40 nm, such as from 4 nm to 15 nm, although lesser and greater thicknesses can also be employed.

Figure 15G:
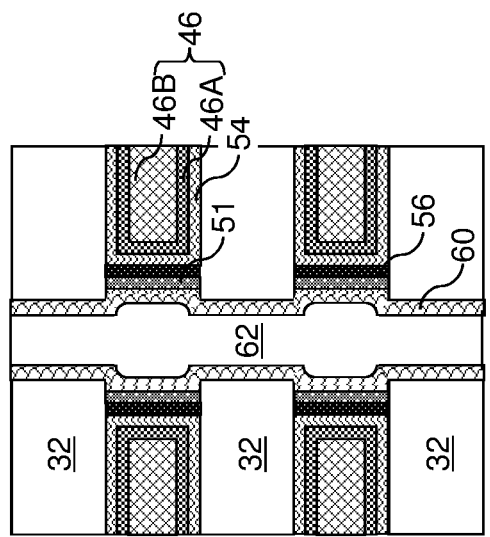

Referring to FIG. 15G, the transition metal conductive liner 48 may be optionally converted into the transition metal oxide conductive layer 46A by oxidation. A thermal oxidation process or a plasma oxidation process may be employed to convert the transition metal conductive liner 48 into the transition metal oxide conductive layer 46A. In an alternative embodiment, conversion of the transition metal conductive liner 48 into the transition metal oxide conductive layer 46A is not performed. In this case, the subsequent exemplary structure includes the transition metal conductive liner 48 instead of the transition metal oxide conductive layer 46A. In another embodiment, the transition metal conductive liner 48 might comprise of a transition metal/metal oxide bilayer as mentioned in an earlier embodiment. In this case, the transition metal conductive liner 48 is processed in three steps. The first step consists of depositing one layer of transition metal, the second step converts it to a transition metal oxide, while the third step comprises of depositing a terminal transition metal liner. In another alternative embodiment, the transition metal oxide conductive layer 46A is directly deposited in the backside recesses 43 instead of being formed by oxidation of the transition metal conductive liner 48.

Figure 15H:
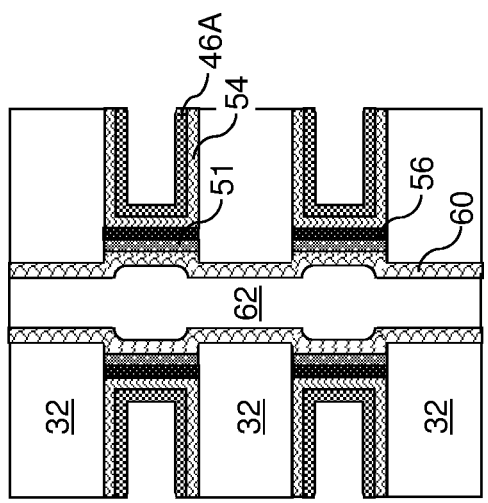

Referring to FIG. 15H, the metal fill material is deposited in remaining volumes of the plurality of backside recesses 43, on the sidewalls of the at least one the backside trench 79, and over the top surface of the contact level dielectric layer 73 to form a conductive fill material layer 46B.

Subsequently, the processing steps of FIGS. 11A and 11B may be performed to remove portions of the transition metal oxide conductive layer 46A and the conductive fill material layer 46B from inside the backside trenches 79 and from above the contact level dielectric layer 73. Each remaining contiguous portion of the transition metal oxide conductive layer 46A and the conductive fill material layer 46B that fills a backside recess 43 constitutes an electrically conductive layer 46. Each of the vertical semiconductor channels 60 can have a laterally-undulating outer sidewall that includes laterally-protruding portions that protrude outward from vertical interfaces with the insulating layers 32 toward a respective one of the electrically conductive layers 46.

FIGS. 15I-15O illustrate various alternative embodiments of the exemplary structure illustrated in FIG. 15H.

The alternative embodiment illustrated in FIG. 15I may be derived from the embodiment illustrated in FIG. 15H by employing a vertical stack of tubular transition metal element spacers 57 as a vertical stack of tubular transition metal element-containing conductive spacers instead of the metal oxide spacers 56.

The alternative embodiment illustrated in FIG. 15J may be derived from the embodiment illustrated in FIG. 15H by employing the transition metal conductive liner 48 instead of the transition metal oxide conductive layer 46A.

The alternative embodiment illustrated in FIG. 15K may be derived from the embodiment illustrated in FIG. 15I by employing the transition metal conductive liner 48 instead of the transition metal oxide conductive layer 46A.

Figure 15M:
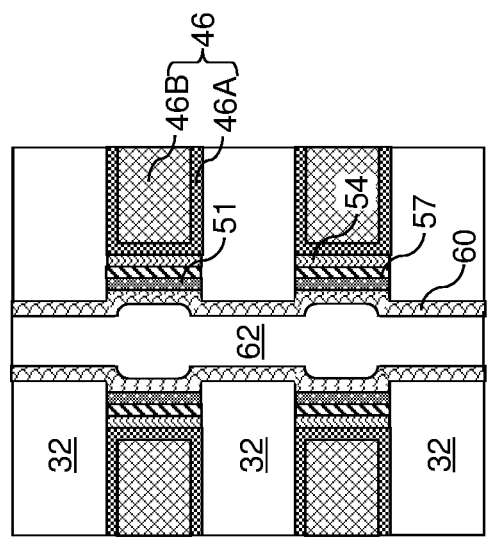
Figure 15L:
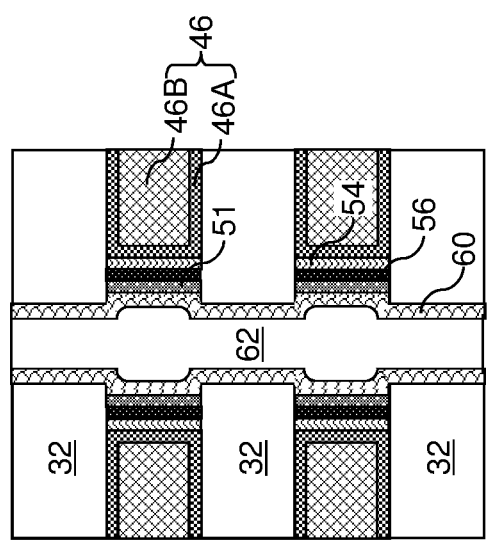

The alternative embodiment illustrated in FIG. 15L may be derived from the embodiment illustrated in FIG. 15H by forming the ferroelectric material layer 54 as a plurality of ferroelectric material layers 54 having a respective cylindrical configuration employing a selective ferroelectric material deposition process that deposits a ferroelectric material only on physically exposed surfaces of the vertical stack of tubular transition metal oxide spacers 56.

The alternative embodiment illustrated in FIG. 15M may be derived from the embodiment illustrated in FIG. 15I by forming the ferroelectric material layer 54 as a plurality of ferroelectric material layers 54 having a respective cylindrical configuration employing a selective ferroelectric material deposition process that deposits a ferroelectric material only on physically exposed surfaces of the vertical stack of tubular transition metal element spacers 57.

The alternative embodiment illustrated in FIG. 15N may be derived from the embodiment illustrated in FIG. 15L by employing the transition metal conductive liner 48 instead of the transition metal oxide conductive layer 46A.

The alternative embodiment illustrated in FIG. 15O may be derived from the embodiment illustrated in FIG. 15M by employing the transition metal conductive liner 48 instead of the transition metal oxide conductive layer 46A.

In the second exemplary structure and various alternative embodiments thereof, a vertical stack of tubular insulating spacers 51 may be formed around each of the vertical semiconductor channels 60 after formation of the backside recesses 43. Each vertical stack of tubular transition metal element-containing conductive spacers (56, 57) is formed directly on a respective vertical stack of tubular insulating spacers 51. The vertical stacks of tubular transition metal element-containing conductive spacers (56, 57) may be formed employing a selective deposition process in which a transition metal element is deposited on physically exposed surfaces of the tubular insulating spacers 51 while deposition of the transition metal element on physically exposed surfaces of the insulating layers 32 is suppressed.

Generally, each of the electrically conductive layers 46 comprises a conductive fill material portion (comprising a portion of a conductive fill material layer 46B) embedded within the transition metal element-containing conductive liner (46A, 48), which may comprise a transition metal conductive liner 48 or a transition metal oxide conductive layer 46A. In one embodiment, the tubular transition metal element-containing conductive spacers comprise tubular transition metal element spacers 57. The spacers 57 comprise and/or consists of a transition metal element that is selected from iridium, ruthenium, palladium, osmium, rhenium, molybdenum or cobalt. In another embodiment, the tubular transition metal element-containing conductive spacers comprise tubular transition metal oxide spacers 56. The metal oxide spacers 56 comprise an oxide of a transition metal element that is selected from iridium, ruthenium, palladium, osmium, rhenium, molybdenum or cobalt.

In some embodiments, a ferroelectric material layer 54 within a backside recess 43 comprises: an upper horizontally-extending portion that contacts a bottom surface of the respective overlying one of the insulating layers 32 and a top surface of a respective electrically conductive layer 46, and a lower horizontally-extending portion that contacts a top surface of the respective underlying one of the insulating layers 32, a bottom surface of the respective electrically conductive layer 46, and a tubular portion vertically extending between the upper horizontally-extending portion and the lower horizontally-extending portion. In this case, each of the plurality of tubular portions laterally surrounds, and contacts, a respective one of the tubular transition metal element-containing conductive spacers (56, 57).

In one embodiment, each of the ferroelectric material layers 54 has a cylindrical configuration, and includes an outer sidewall that has an upper periphery that contacts an overlying one of the insulating layers 32 and has a lower periphery that contacts an underlying one of the insulating layers 32. The set of all material portions that are laterally surrounded by the ferroelectric material layers 54 constitutes a memory opening fill structure 58. In one embodiment, a vertical stack of tubular insulating spacers 51 is formed. Each of the tubular insulating spacers 51 contacts an inner sidewall of a respective one of the tubular transition metal element-containing conductive spacers (56, 57) and contacts a portion of an outer sidewall of a respective vertical semiconductor channel 60.

Referring to all drawings and according to various embodiments of the present disclosure, a three-dimensional ferroelectric memory device includes an alternating stack of insulating layers 32 and electrically conductive layers 46 located over a substrate (9, 10), where each of the electrically conductive layers 46 contains a transition metal element-containing conductive liner (48, 46A) and a conductive fill material portion 46B, a vertical semiconductor channel 60 extending vertically through the alternating stack (32, 46), a vertical stack of tubular transition metal element-containing conductive spacers (56, 57) laterally surrounding the vertical semiconductor channel 60 and located at levels of the electrically conductive layers 46, and a ferroelectric material layer 54 located between the vertical stack of tubular transition metal element-containing conductive spacers (56, 57) and the transition metal element-containing conductive liner (48, 46A).

The configuration of a stack of a tubular transition metal element-containing conductive spacer (56 or 57), a ferroelectric material layer 54, and a transition metal element-containing conductive liner (48, 46A) may suppress polarization fatigue of the material of the ferroelectric material layer 54 because the spacer and/or the liner may function as sinks for oxygen vacancies of the ferroelectric material layer 54. Thus, oxygen vacancy migration in the ferroelectric material layer 54 may be reduced or eliminated by employing the configurations of the layer stack including a tubular transition metal element-containing conductive spacer (56 or 57), a ferroelectric material layer 54, and a transition metal element-containing conductive liner (48, 46A) of the embodiments of the present disclosure. This may result in superior durability of the ferroelectric material layer 54 and prolonged operational lifetime of the ferroelectric NAND memory device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional ferroelectric memory device, comprising:
    an alternating stack of insulating layers and electrically conductive layers located over a substrate, wherein each of the electrically conductive layers comprises a transition metal element-containing conductive liner and a conductive fill material portion;
    a vertical semiconductor channel extending vertically through the alternating stack;
    a vertical stack of tubular transition metal element-containing conductive spacers laterally surrounding the vertical semiconductor channel and located at levels of the electrically conductive layers; and
    a ferroelectric material layer located between the vertical stack of tubular transition metal element-containing conductive spacers and the transition metal element-containing conductive liner;
    wherein the ferroelectric material layer comprises:
        an upper horizontally-extending portion that contacts a bottom surface of the respective overlying one of the insulating layers and a top surface of a respective electrically conductive layer;
        a lower horizontally-extending portion that contacts a top surface of the respective underlying one of the insulating layers and a bottom surface of the respective electrically conductive layer; and
        a tubular portion vertically extending between the upper horizontally-extending portion and the lower horizontally-extending portion, wherein the tubular portion laterally surrounds and contacts a respective one of the tubular transition metal element-containing conductive spacers.

2. The three-dimensional ferroelectric memory device of claim 1, wherein the transition metal element-containing conductive liner comprises a transition metal element that is selected from iridium, ruthenium, palladium, osmium, rhenium, molybdenum or cobalt.

3. The three-dimensional ferroelectric memory device of claim 2, wherein the transition metal element-containing conductive liner consists essentially of a conductive oxide of the transition metal element.

4. The three-dimensional ferroelectric memory device of claim 2, wherein the transition metal element-containing conductive liner consists essentially of the transition metal element.

5. The three-dimensional ferroelectric memory device of claim 1, wherein the tubular transition metal element-containing conductive spacers comprise a transition metal element that is selected from iridium, ruthenium, palladium, osmium, rhenium, molybdenum or cobalt.

6. The three-dimensional ferroelectric memory device of claim 5, wherein the tubular transition metal element-containing conductive spacers consist essentially of a conductive oxide of the transition metal element.

7. The three-dimensional ferroelectric memory device of claim 5, wherein the tubular transition metal element-containing conductive spacers consist essentially of the transition metal element.

8. The three-dimensional ferroelectric memory device of claim 1, further comprising a tubular insulating spacer layer which contacts an inner sidewall of a respective one of the tubular transition metal element-containing conductive spacers and contacts a portion of an outer sidewall of the vertical semiconductor channel.

9. The three-dimensional ferroelectric memory device of claim 1, further comprising a vertical stack of tubular insulating spacers, wherein each of the tubular insulating spacers contacts an inner sidewall of a respective one of the tubular transition metal element-containing conductive spacers and contacts a portion of an outer sidewall of the vertical semiconductor channel.

10. The three-dimensional ferroelectric memory device of claim 1, wherein the vertical semiconductor channel has a straight outer sidewall that extends through each layer within the alternating stack and contacts a set of sidewalls of the insulating layers.

11. The three-dimensional ferroelectric memory device of claim 1, wherein the vertical semiconductor channel has a laterally-undulating outer sidewall that includes laterally-protruding portions that protrude outward from vertical interfaces with the insulating layers toward a respective one of the electrically conductive layers.

* * * * *